(12) United States Patent
Lin et al.

(10) Patent No.: US 12,245,526 B2
(45) Date of Patent: *Mar. 4, 2025

(54) SIDEWALL PROTECTION FOR PCRAM DEVICE

(71) Applicant: TAIWAN SEMICONDUCTOR MANUFACTURING CO., LTD., Hsinchu (TW)

(72) Inventors: Yu-Chao Lin, Hsinchu (TW); Yuan-Tien Tu, Chiayi County (TW); Shao-Ming Yu, Hsinchu County (TW); Tung-Ying Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/475,978

(22) Filed: Sep. 27, 2023

(65) Prior Publication Data

US 2024/0023462 A1 Jan. 18, 2024

Related U.S. Application Data

(60) Continuation of application No. 17/839,322, filed on Jun. 13, 2022, now Pat. No. 11,818,967, which is a (Continued)

(51) Int. Cl.
*H10N 70/00* (2023.01)
*H10N 70/20* (2023.01)

(52) U.S. Cl.
CPC ......... *H10N 70/063* (2023.02); *H10N 70/023* (2023.02); *H10N 70/231* (2023.02); *H10N 70/826* (2023.02)

(58) Field of Classification Search
CPC .. H10N 70/011; H10N 70/021; H10N 70/023; H10N 70/063; H10N 70/231;
(Continued)

(56) References Cited

U.S. PATENT DOCUMENTS 11,818,967 B2 * 11/2023 Lin ..................... H10N 70/021
2008/0044632 A1    2/2008 Liu et al.
(Continued)

FOREIGN PATENT DOCUMENTS

CN    108699427 A    10/2018
JP    2010278275 A    12/2010

*Primary Examiner* — Fazli Erdem
(74) *Attorney, Agent, or Firm* — Maschoff Brennan

(57) ABSTRACT

A phase change random access memory (PCRAM) device includes a memory cell overlying an inter-metal dielectric (IMD) layer, a protection coating, and a first sidewall spacer. The memory cell includes a bottom electrode, a top electrode and a phase change element between the top electrode and the bottom electrode. The protection coating is on an outer sidewall of the phase change element. The first sidewall spacer is on an outer sidewall of the protection coating. The first sidewall spacer has a greater nitrogen atomic concentration than the protection coating. The protection coating forms a first interface with the phase change element. The first interface has a first slope at a first position and a second slope at a second position higher than the first position, the second slope is different from the first slope.

20 Claims, 17 Drawing Sheets

Related U.S. Application Data division of application No. 16/509,105, filed on Jul. 11, 2019, now Pat. No. 11,362,277.

(60) Provisional application No. 62/767,372, filed on Nov. 14, 2018.

(58) Field of Classification Search
CPC .............. H10N 70/801; H10N 70/826; H10N 70/8828; H10B 63/30
USPC ........................................................... 257/2
See application file for complete search history.

(56) References Cited

U.S. PATENT DOCUMENTS

| | | |
|---|---|---|
| 2009/0206317 A1* | 8/2009 | Kang .................. H10N 70/801 |
| | | 438/102 |
| 2009/0321708 A1 | 12/2009 | Rho et al. |
| 2013/0075682 A1 | 3/2013 | Lee |
| 2013/0260561 A1 | 10/2013 | Ranjan et al. |
| 2014/0252295 A1* | 9/2014 | Liao ....................... H10B 63/80 |
| | | 257/2 |
| 2015/0243709 A1 | 8/2015 | Song et al. |
| 2016/0163594 A1 | 6/2016 | Kim |
| 2017/0117467 A1 | 4/2017 | Chang et al. |
| 2018/0175165 A1 | 6/2018 | Lim et al. |
| 2019/0296232 A1 | 9/2019 | He et al. |
| 2019/0296236 A1* | 9/2019 | He ....................... H10N 70/063 |
| 2020/0279998 A1* | 9/2020 | Lin ................... H10N 70/8616 |
| 2020/0365799 A1* | 11/2020 | Lee .................... H10N 70/231 |

* cited by examiner

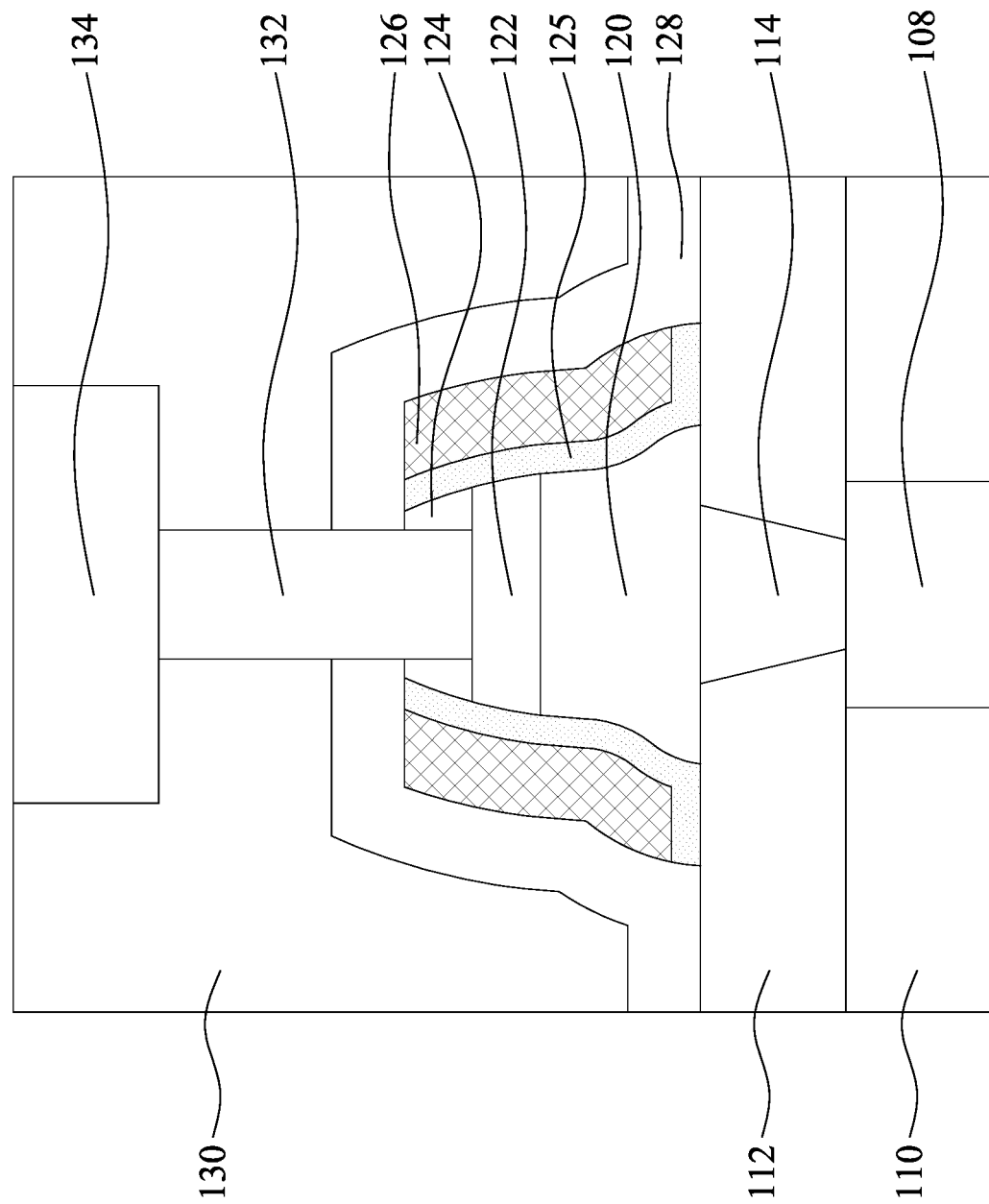

SIDEWALL PROTECTION FOR PCRAM DEVICE

PRIORITY CLAIM AND CROSS-REFERENCE

This application is a continuation application of the U.S. application Ser. No. 17/839,322, filed Jun. 13, 2022, which is a divisional application of the U.S. application Ser. No. 16/509,105, filed Jul. 11, 2019, now U.S. Pat. No. 11,362,277, issued Jun. 14, 2022, which claims priority to U.S. Provisional Application Ser. No. 62/767,372, filed Nov. 14, 2018, all of which are herein incorporated by reference in their entirety.

BACKGROUND

Flash memory is a widely used type of nonvolatile memory. However, flash memory is expected to encounter scaling difficulties. Therefore, alternatives types of nonvolatile memory are being explored. Among these alternatives types of nonvolatile memory is phase change memory (PCM). PCM is a type of nonvolatile memory in which a phase of a phase change element is employed to represent a unit of data. PCM has fast read and write times, non-destructive reads, and high scalability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5-14 illustrate cross-sectional views of some embodiments of a method of forming a memory device according to the present disclosure.

DETAILED DESCRIPTION

Figure 1:
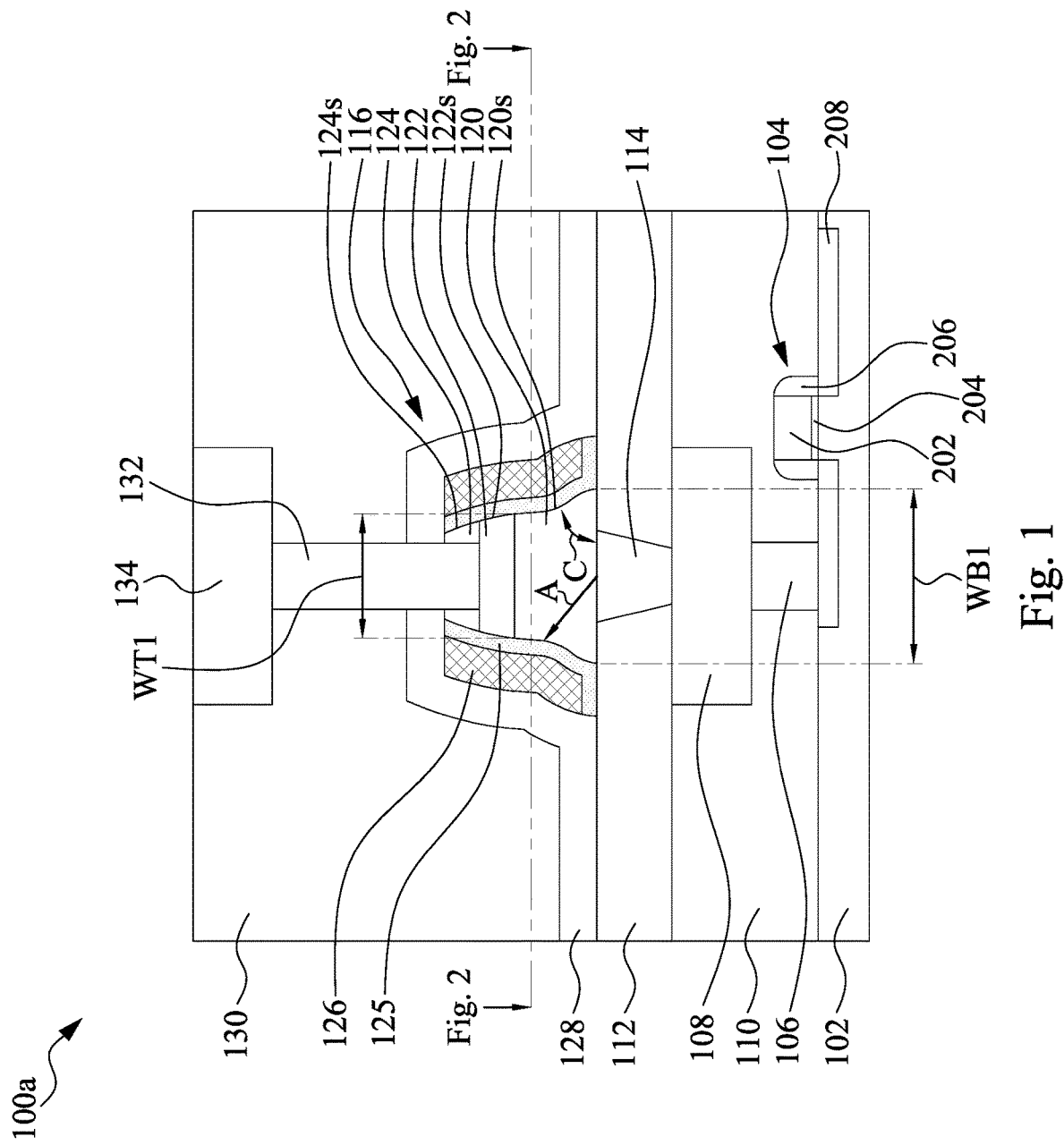
FIG. 1 illustrates a cross-sectional view of some embodiments of a memory device, according to the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A phase change memory (PCM) cell includes a phase change element (PCE) sandwiched between a bottom electrode and a top electrode. In some embodiments, the PCE is made of chalcogenide glass. Chalcogenide glass has crystalline and amorphous states with drastically different electrical resistivity values, such that the PCE can be switched between the crystalline and amorphous states to correspond to different data states. More particularly, during operation of some PCM cells, the PCE can be heated to a higher temperature (e.g., over 600 degrees Celsius) than its melting point, which causes the chalcogenide glass to lose its crystallinity. The PCE can then be quickly cooled or "quenched" to "freeze" the PCE in an amorphous, high resistance state, which can for example correspond to a "0" data state. This operation can be referred to as a "reset" operation of the PCM cell. On the other hand, by heating the PCE to a lower temperature (e.g., about 100-150 degrees Celsius), wherein the lower temperature is above its crystallization point but below its melting point, the PCE will transform into the low-resistance, crystalline state, which can for example correspond to a "1" state. This operation can be referred to as a "set" operation of the PCM cell.

During a method for manufacturing this PCM cell, a nitride-based spacer layer (e.g., SiN or SiON layer) is formed over a patterned PCM, followed by patterning the nitride-based spacer layer into a nitride-based sidewall spacer remaining on a sidewall of the PCE cell. Aspects of the present disclosure lie in an appreciation that the nitride-based spacer layer is deposited using a plasma deposition process, and the reactive plasmas would react with outermost sidewalls of the PCE during the deposition, thus resulting in damages (e.g., voids) on the sidewalls of the PCE. Aspects of the present disclosure further lie in an appreciation that the nitride-based spacer layer is patterned using a plasma etching process, and the etchant might attack the damaged sidewalls of the PCE, which in turn would aggravate damages on the sidewalls of the PCE (e.g., enlarging voids on PCE's sidewalls).

Therefore, in some embodiments of the present disclosure, a sidewall protection coating is formed on outer sidewalls of the PCE before forming a nitride-based spacer layer. The protection coating is deposited using plasmas chemically inert to the PCE. The term "chemically inert" used in this context means that no chemical reaction is generated between plasmas and materials exposed to the plasmas. Thus, this deposition process does not induce a chemical reaction with the PCE and hence prevents sidewalls of the PCE from damages (e.g., voids). Moreover, the sidewall protection coating can block sidewalls of the PCE from reactive plasmas during nitride-based spacer layer deposition and/or from etchants during spacer patterning process. As a result, damages on sidewalls of the PCE can be reduced.

Figure 2:
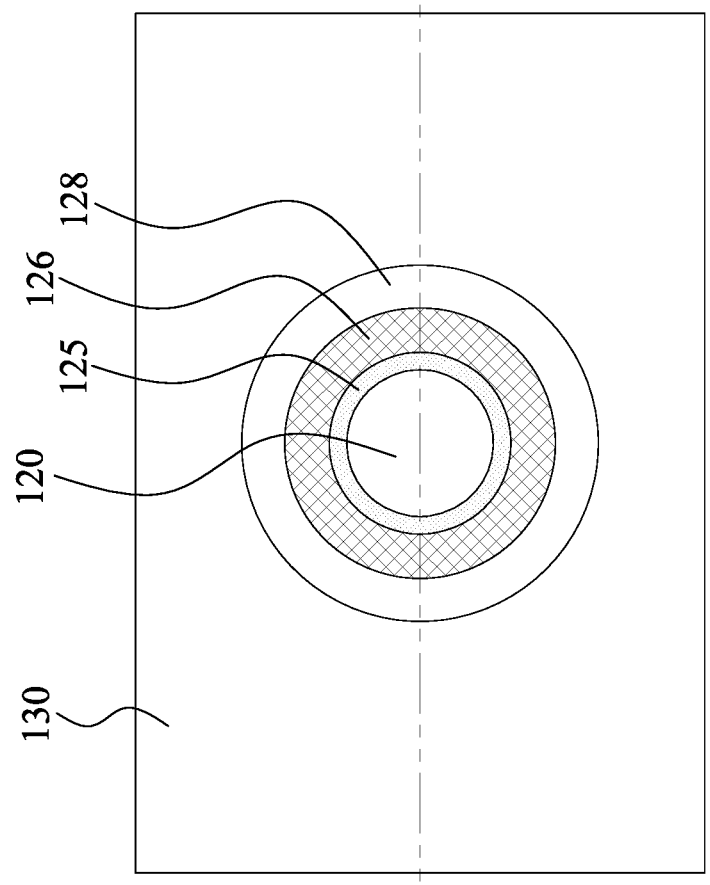
FIG. 2 illustrates a top view of the memory device of FIG. 1, as indicated by the cut-line in FIG. 1, according to some embodiments of the present disclosure.

Referring to FIG. 1, a cross-sectional view of a memory device 100a in accordance with some embodiments is provided. Referring to FIG. 2, a top view of FIG. 1's memory device 100a as indicated in the cut-away line shown in FIG. 1 in accordance with some embodiments is provided.

The memory device 100a includes a phase change memory (PCM) cell 116. The PCM cell 116 includes a bottom electrode 114, a top electrode 122 and a phase change element (PCE) 120 between the bottom electrode 114 and the top electrode 122. The bottom electrode 114 is disposed within a dielectric layer 112. The PCE 120 overlies the bottom electrode 114. The top electrode 122 overlies the PCE 120. The memory device 100a further includes a hard mask 124, a protection coating (interchangeably referred to as protection layer) 125, a first sidewall spacer 126 and a second sidewall spacer 128. The hard mask 124 overlies the top electrode 122. The protection coating 125 directly contacts outer sidewalls 120s of the PCE 120, outer sidewalls 122s of the top electrode 122, and outer sidewalls 124s of the hard mask 124, but is separated from the bottom electrode 114. The first sidewall spacer 126 directly contacts outer sidewalls of the protection coating 125. The second sidewall spacer 128 has a first portion directly contacting outer sidewalls of the first sidewall spacer 126 and extending continuously from an upper surface of the hard mask 124 to an upper surface of the dielectric layer 112, and a second portion extending from a bottom of the first portion along a top surface of the dielectric layer 112 in a direction away from the bottom electrode 114. In some embodiments, the protection coating 125 is comprised of a material different from the first sidewall spacer 126 and the second sidewall spacer 128. In some embodiments, the first sidewall spacer 126 is comprised of a material different from the second sidewall spacer 128.

The PCM cell 116 is disposed over a substrate 102 with an inter-metal layer (IMD) layer 110 disposed over the substrate 102. A bottom conductive wire 108 overlying a bottom interconnect via 106 electrically couples the PCM cell 116 to a transistor 104. In some embodiments, the bottom conductive wire 108 and bottom interconnect via 106 electrically couple the PCM cell 116 to underlying metal layers and/or an electrical component such as a resistor, a capacitor, and/or a diode. Another IMD layer 130 is disposed over the PCM cell 116. A conductive via 132 is disposed over the top electrode 122, and connects the top electrode 122 to an upper metal layer including an upper conductive wire 134. The conductive via 132 and the upper conductive wire 134 reside within the IMD layer 130 and may, for example, electrically couple the top electrode 122 to a bit line (not shown).

In some embodiments, during operation of the PCM cell 116, the PCM cell 116 varies between states depending upon a voltage applied from the upper conductive wire 134 to the bottom conductive wire 108. The PCM cell 116 may, for example, be in a low-resistance state where the PCE 120 is in a crystalline phase. Changing the PCE 120 to the crystalline phase (i.e., set operation) may, for example, be performed by heating the PCE 120 to a relatively low temperature (e.g., higher than crystallization point of the PCE 120 but lower than the melting point of the PCE 120) using Joule heating resulting from an electric current flowing through the PCE 120. The electric current flowing through the PCE 120 in the set operation is referred to as a set current $I_{set}$. On the other hand, the PCM cell 116 may, for example, be in a high resistance state where the PCE 120 is in an amorphous phase. Changing the PCE 120 to the amorphous phase (i.e., reset operation) may, for example, be performed by heating the PCE 120 to a relatively high temperature (e.g., higher than the melting point of the PCE 120) using Joule heating resulting from another electric current flowing through the PCE 120. The electric current flowing through the PCE 120 in the reset operation is referred to as a reset current $I_{reset}$.

In some embodiments, outer sidewalls 120s of the PCE 120 are absent of any voids. In some embodiments, the PCE 120 is a continuous layer extending from a lower surface of the top electrode 122 to the upper surface of the dielectric layer 112 and an upper surface of the bottom electrode 114. Outer sidewalls 120s of the PCE 120 may be substantially aligned with outer sidewalls 122s of the top electrode 122 and outer sidewalls 124s of the hard mask 124. The protective coating 125 is configured and/or formed in such a manner to prevent the PCE 120 from reacting with plasmas used in formation of the first sidewall spacer 126. Therefore, formation of the first sidewall spacer 126 can result in no observable damage on outer sidewalls 120s of the PCE 120 (e.g., resulting in no void on outer sidewalls 120s of the PCE 120). In some embodiments, the protection coating 125 is further configured to suppress outgassing from the PCE 120 to an ambient environment and/or from the IMD layer 130 to the PCE 120, because the outer sidewalls 120s of the PCE 120 is separated from the IMD layer 130 by triple layers (e.g., layers 125, 126 and 128), instead of dual layers (e.g., dual spacer layers 126 and 128 without the coating layer 125). Therefore, toxic gases resulting from outgassing of the material of the PCE 120 can be reduced, and unwanted oxidation of the PCE 120 resulting from outgassing of the oxide material from the IMD layer 130 can be reduced as well.

Top view of FIG. 2 corresponds to an image taken using an imaging tool (e.g., SEM, TEM, or the like) along the cut-away line shown in FIG. 1. In some embodiments, if when viewed from above the PCM cell 116 is circular/elliptical then the protection coating 125 is a single continuous annular (i.e., ring-shaped) coating layer when viewed from above (see e.g., FIG. 2), therefore the protection coatings 125 on opposite sidewalls of the PCE 120 refer to the nature of this single continuous annular coating layer when depicted in in a cross-sectional view. Additionally, if when viewed from above the PCM cell 116 is circular or elliptical then any length and/or width associated with a cross-sectional view of the layers comprising the PCM cell 116 respectively correspond to diameters of a circle or lengths defined between two vertices on the major axis of an ellipse.

In some embodiments, the PCE 120 comprises a chalcogenide material, which is an alloy comprising an element of the VI group, combined with elements in the IV and/or V groups. The PCM layer 118 may comprise, for example, $Ge_2Sb_2Te_5$ (GST), ScSbTe, GeTe, InSb, $Sb_2Te_3$, $Sb_{70}Te_{30}$, GaSb, InSbTe, GaSeTe, $SnSbTe_4$, InSbGe, AgInSbTe, $Te_{81}Ge_{15}Sb_2S_2$, GeSbTe, SnSbTe, GeSbSe, GeSbTe, or the like.

In some embodiments, the protection coating 125 is a carbon-based material or a carbon-hydrogen based material. Moreover, the protection coating 125 is nitrogen-free, so that the protection coating 125 can be formed without using a nitrogen-containing precursor, thus preventing a chemical reaction with the PCE 120 during formation of the protection coating 125 as will be discussed below. Further, the protection coating 125 is a binary carbon-hydrogen compound, which provides a higher adhesion with the nitride-based spacer 126 than ternary carbon-hydrogen compounds. For example, the protection coating 125 may be a $CH_x$ binary compound, wherein x is between 2 and 4. In some embodiments, the thickness of the protection coating 125 may be in a range of between approximately 10 angstroms and approximately 20 angstroms. If the thickness of the protection coating 125 is greater than approximately 20 angstroms, then it might suffer from film-to-film adhesion issues (e.g., poor adhesion between the protection coating 125 and the nitride-based spacer 126), and might further have unsatisfactory surface roughness. If the thickness of the protection coating 125 is less than approximately 10 angstroms, then the sidewall protection for the PCE 120 might be unsatisfactory.

In some embodiments, the first sidewall spacer 126 is oxygen-free, thus preventing unwanted oxidation of the PCE 120 caused by outgassing of oxygen-containing materials. For example, the first sidewall spacer 126 may be or comprise silicon nitride (SiN or $Si_3N_4$), silicon carbide (SiC), or other suitable oxygen-free dielectric materials formed with a low temperature (less than approximately 250 degrees Celsius). In some embodiments, the second sidewall spacer 128 may, for example, be or comprise SiC, silicon oxycarbide (SiOC), the like, or combinations thereof.

In some embodiments, the top electrode 122 may, for example, be or comprise cupper (Cu), aluminum copper (AlCu), titanium nitride (TiN), tantalum nitride (TaN), titanium tungsten (TiW), titanium tungsten nitride (TiWN), titanium tantalum nitride (TiTaN), tungsten (W), the like or combinations thereof. In some embodiments, the bottom electrode 114 may, for example, be or comprise Cu, TiN, TiW, TiWN, TiTaN, TaN, W, the like, or combinations thereof. In some embodiments, the hard mask 124 may, for example, be or comprise silicon, silicon oxide ($SiO_2$), silicon oxynitride (SiON), silicon nitride (SiN), silicon-doped carbon, carbon, the like or combinations thereof.

In some embodiments, the conductive via 132 and the upper conductive wire 134 may, for example, respectively be or comprise Cu, AlCu, Al, TiN, TaN, the like or combinations thereof. In some embodiments, the dielectric layer 112 may, for example, be or comprise SiN, SiC, SiON, SiOC, or the like. In some embodiments, the IMD layer 130 may, for example, be or comprise tetra-ethyl-ortho-silicate (TEOS) (e.g., plasma enhanced TEOS, low particle TEOS, etc.), an extreme low-k dielectric, or the like.

In some embodiments, the PCE 120 has a trapezoid-like shape, where a top surface of the PCE 120 is narrower than a bottom surface of the PCE 120. In greater detail, the PCE 120 has a width that decreases as a distance from the bottom electrode 114 increases. In this way, a width WT1 of the top surface of the PCE 120 is less than a width WB1 of the bottom surface of the PCE 120. The top and bottom surfaces of the PCE 120 may be connected by outer sidewalls 120s that are angled. Additionally, the top electrode 122 and the hard mask 124 may exhibit similar trapezoid-like shapes.

The trapezoid-like PCE 120 can reduce the thermal dissipation path and thus increase thermal confinement in the PCE 120. The thermal dissipation path refers to a distance between the bottom electrode 114 and outer sidewalls 120s of the PCE 120. An example of one of many thermal dissipation paths is illustrated by arrow A. By reducing the thermal dissipation path and increasing thermal confinement in the PCE 120, the reset current $I_{reset}$ and/or set current set current $I_{set}$ of the PCRAM device 100a are decreased.

In some embodiments, the bottom surface of the PCE 120 meets the outer sidewalls 120s of the PCE 120 at an angle C. To achieve sufficient thermal confinement to reduce the reset current $I_{reset}$ and/or set current set current $I_{set}$ of the PCRAM device 100a, the angle C may be an acute angle. For example, in some embodiments, to achieve sufficient thermal confinement to reduce the reset current $I_{reset}$ and/or set current set current $I_{set}$ of the PCRAM device 100a, the angle C may be in a range of between approximately 45 degrees to approximately 85 degrees.

Due to the nature of trapezoid-like shape, the width WB1 of the bottom surface of the PCE 120 is greater than the width WT1 of the top surface of the PCE 120. Similarly, the width WT1 of the top surface of the PCE 120 is greater than a width of the top surface of the top electrode 122, and the width of the top surface of the top electrode 122 is greater than a width of the top surface of the hard mask 124. In some embodiments, the width WB1 of the bottom surface of the PCE 120, the width WT1 of the top surface of the PCE 120, and the width of the top surface of the top electrode 122 are in a range from approximately 20 nanometers to approximately 300 nanometers.

The transistor 104 includes a gate electrode 202, a gate dielectric 204, transistor sidewall spacers 206, and source/drain regions 208. The bottom interconnect via 106 is electrically coupled to a source/drain region 208 of the transistor 104. The source/drain regions 208 are disposed within the substrate 102 on either side of the gate electrode 202. Further, the source/drain regions 208 are doped to have a first conductivity type which is opposite a second conductivity type of a channel region in the substrate 102 and under the gate dielectric 204. The gate electrode 202 may be, for example, doped polysilicon or a metal, such as TaN, TiN, tungsten or combinations thereof. The gate dielectric 204 may be, for example, an oxide, such as silicon dioxide, or a high-k dielectric material. The transistor sidewall spacers 206 can be made of silicon nitride (e.g., SiN or $Si_3N_4$), for example.

Figure 3:
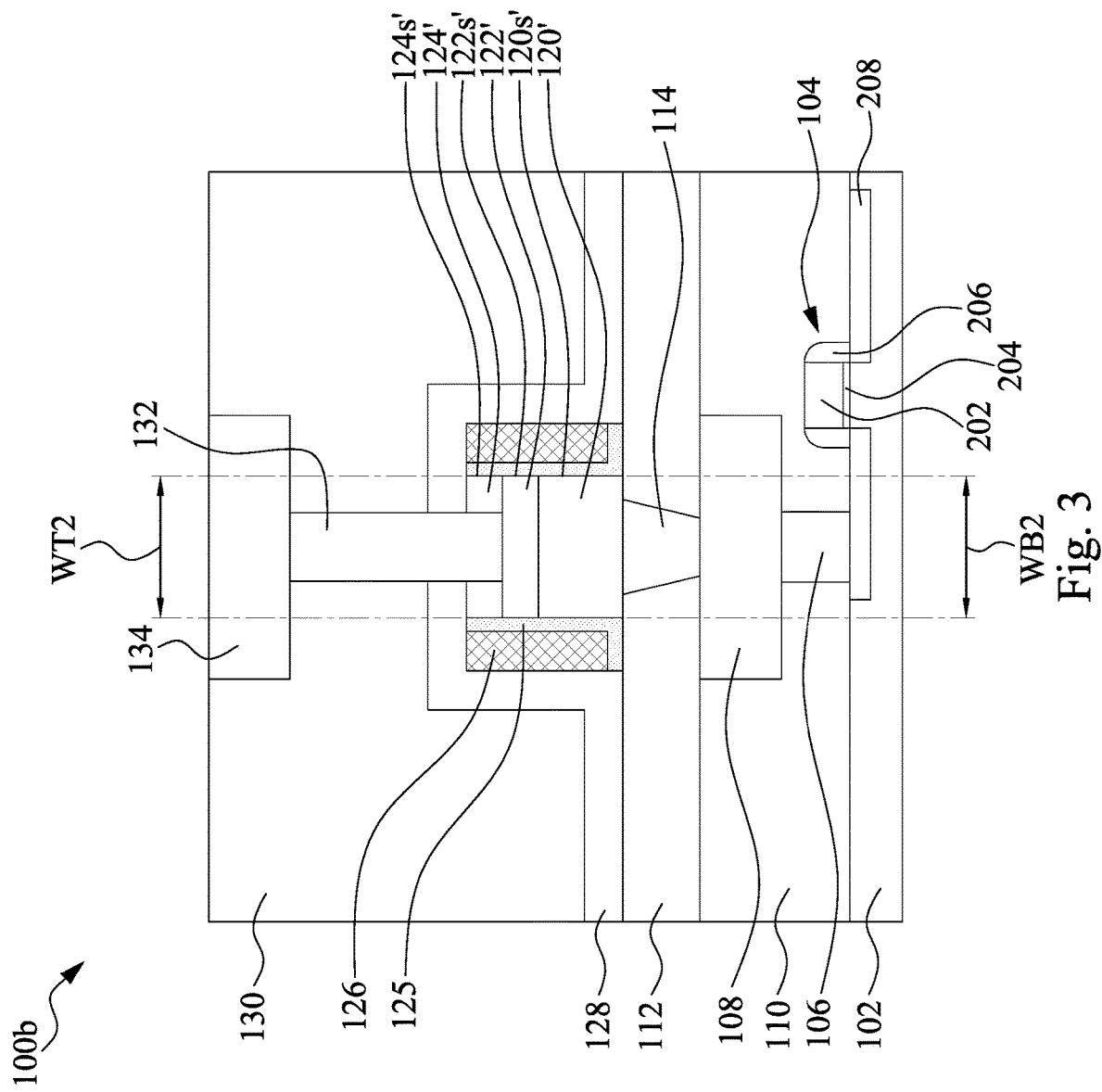
FIG. 3 illustrates a cross-sectional view of some alternative embodiments of the memory device of FIG. 1, according to the present disclosure.

Referring to FIG. 3, a cross-sectional view 100b of some alternative embodiments of the memory device of FIG. 1 is provided in which the PCE 120' has a rectangular shape in cross-sectional view. Stated differently, the PCE 120' has a width remaining substantially constant as a distance from the bottom electrode 114 increases. In this way, a width WT2 of the top surface of the PCE 120' is substantially equal to a width WB2 of the bottom surface of the PCE 120'. The top and bottom surfaces of the PCE 120' may be connected by outer sidewalls 120s' that are substantially vertical. Additionally, in the cross-sectional view the top electrode 122' and the hard mask 124' may exhibit similar rectangular shapes and have substantially vertical sidewalls 122s' and 124s', respectively.

Figure 4:
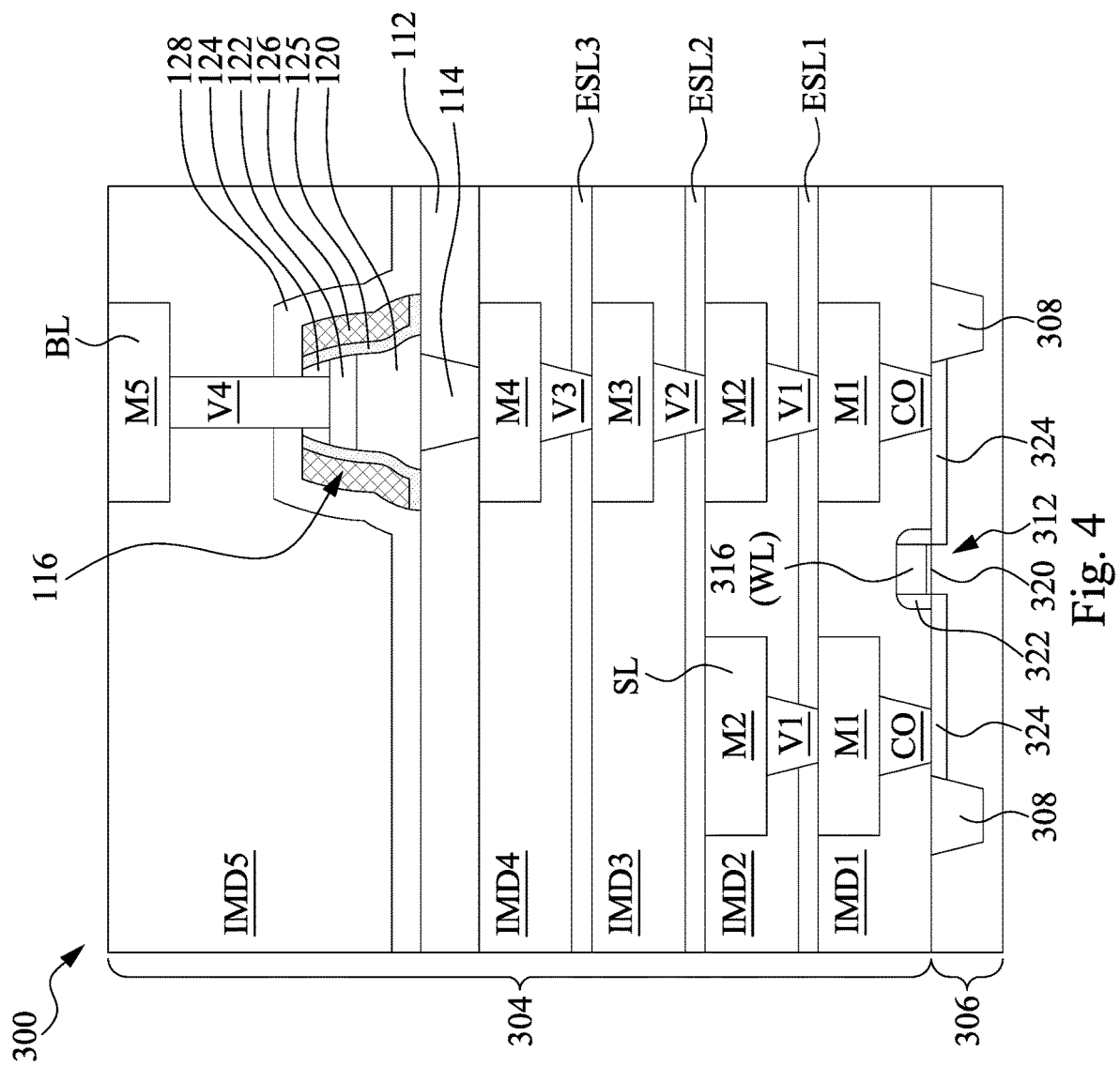
FIG. 4 illustrates a cross-sectional view of some embodiments of an integrated circuit (IC) including a memory device of FIG. 1, according to the present disclosure.

FIG. 4 illustrates a cross-sectional view of some embodiments of an integrated circuit 300 which includes a memory cell 116 disposed in an interconnect structure 304 of the integrated circuit 300. In some embodiments, the memory cell 116 the same as the PCM cell 116 of FIG. 1 is illustrated and described.

The integrated circuit 300 includes a substrate 306. The substrate 306 may be, for example, a bulk substrate (e.g., a bulk silicon substrate) or a silicon-on-insulator (SOI) substrate. The illustrated embodiments depict one or more shallow trench isolation (STI) regions 308, which may include a dielectric-filled trench within the substrate 306.

An access transistor 312 is disposed between the STI regions 308. The access transistor 312 includes an access gate electrode 316, an access gate dielectric 320, access sidewall spacers 322, and source/drain regions 324. The source/drain regions 324 are disposed within the substrate 306 between the access gate electrode 316 and the STI regions 308, and are doped to have a first conductivity type which is opposite a second conductivity type of a channel region under the gate dielectric 320. The access gate electrode 316 may be, for example, doped polysilicon or a metal, such as aluminum, copper, or combinations thereof. The access gate dielectric 320 may be, for example, an oxide, such as silicon dioxide, or a high-k dielectric material. The access sidewall spacers 322 can be made of silicon nitride (e.g., SiN or $Si_3N_4$), for example. In some embodiments, the access transistor 312 may, for example, be electrically coupled to a word line (WL) such that an appropriate WL voltage can be applied to the access gate electrode 316.

The interconnect structure 304 is arranged over the substrate 306 and couples devices (e.g., transistors 312) to one another. The interconnect structure 304 includes a plurality of IMD layers IMD1, IMD2, IMD3, IMD4 and IMD5 and a plurality of metallization layers M1, M2, M3, M4 and M5 which are layered over one another in alternating fashion. The IMD layers IMD1-IMD5 may be made, for example, of a low-k dielectric, such as un-doped silicate glass, or an oxide, such as silicon dioxide, or an extreme low-k dielectric layer. The metallization layers M1-M5 each include metal lines or wires which are formed within trenches in respective IMD layers IMD1-IMD5, and which may be made of one or more metals, such as TiN, TaN, copper, aluminum, tungsten, the like or combinations thereof. Contacts CO extend from the bottom metallization layer M1 to the source/drain regions 324 and/or the gate electrode 316; vias V1 extend between the metallization layers M1 and M2; vias V2 extend between the metallization layers M2 and M3; vias V3 extend between the metallization layers M3 and M4; and vias V4 extend between the metallization layer M5 and top electrodes 122 of PCM cells 116. The vias V1-V3 extend through etch stop layers ESL1, ESL2 and ESL3. The vias V4 extend through the second sidewall spacer 128 and the hard mask 124. The etch stop layers ESL1-ESL3 may be made of SiC or SiN, for example. The contacts CO and the vias V1-V4 may be made of one or more metals, such as TiN, TaN, copper, aluminum, tungsten, the like or combinations thereof.

The memory cell 116, which is configured to store a data state, is arranged within the interconnect structure 304 between the metal layers M4 and M5. For example, the bottom electrode 114 of the memory cell 116 extends from a top surface of the metal layer M4 to the PCE 120, and the via V4 extends from a top surface of the top electrode 122 to the metal layer M5 through the hard mask 124, the second sidewall spacer 128 and the IMD layer IMD5. The memory cell 116 is connected to a bit line (BL) through the metal layer M5, a source line (SL) through the metal layer M2 and a word line (WL) through the gate electrode 316, wherein the word line WL may be formed in the metal layer M3.

FIGS. 5-14 illustrate cross-sectional views of some embodiments of a method of forming a memory device according to the present disclosure. Although the cross-sectional views shown in FIGS. 5-14 are described with reference to a method, it will be appreciated that the structures shown in FIGS. 5-14 are not limited to the method but rather may stand alone separate of the method. Although FIGS. 5-14 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
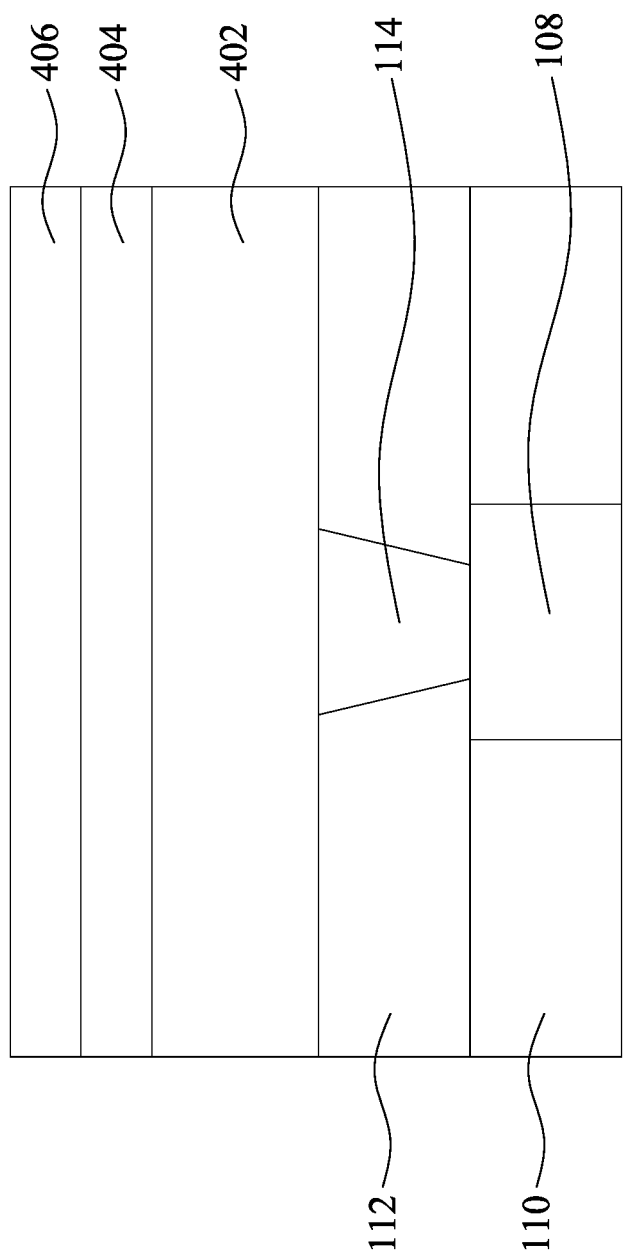

As shown in cross-sectional view of FIG. 5, an initial structure comprises; a bottom conductive wire 108 within an IMD layer 110; a dielectric layer 112 over the bottom conductive wire 108 and the IMD layer 110; a bottom electrode 114 within the dielectric layer 112 overlying the bottom conductive wire 108; a phase change material layer 402 over the dielectric layer 112 and the bottom electrode 114; a top electrode layer 404 over the phase change material layer 402; and a hard mask layer 406 over the top electrode layer 404. In some embodiments, the phase change material layer 402 may, for example, be or comprise a phase change material such as GST.

Formation of the bottom conductive wire 108 includes forming a trench in the IMD layer 110 using suitable etching techniques, depositing one or more metal layers into the trench in the IMD layer 110, and removing excess materials of the one or more metal layers outside the trench in the IMD layer 110. The phase change material layer 402, the top electrode layer 404 and the hard mask layer 406 can be formed using suitable deposition techniques, such as chemical vapor deposition (CVD), physical vapor deposition (PVD), sputtering or the like.

Figure 6:
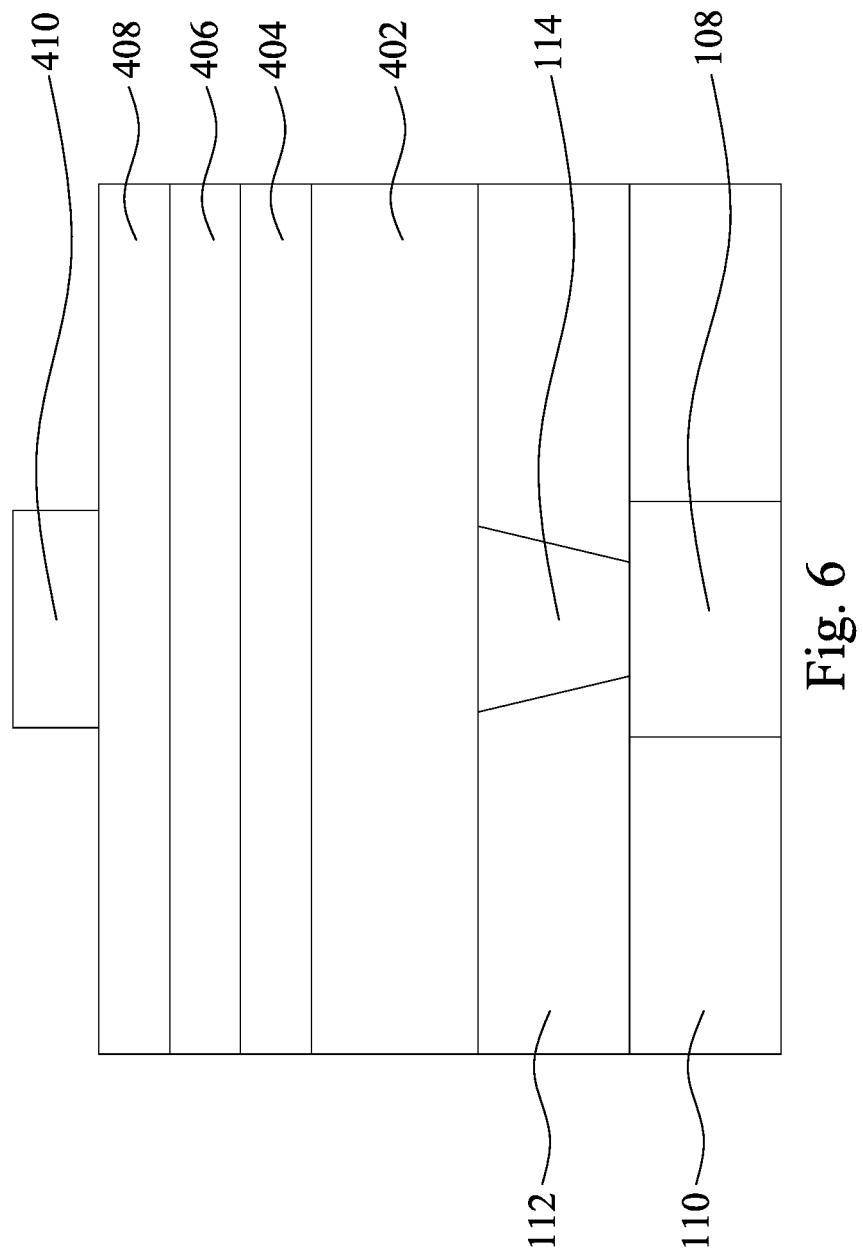

As shown in cross-sectional view of FIG. 6, an organic mask layer 408 and an overlying photoresist 410 are deposited over the hard mask layer 406. In some embodiments, the photoresist 410 and the organic mask layer 408 are deposited using a spin coating process, a deposition process, or the like. The organic mask layer 408 may be a bottom anti-reflective coating (BARC), an anti-reflective coating (ARC), a bottom photoresist coating layer, or the like. The photoresist 410 comprises a photosensitive material. Using photolithography, the photoresist 410 is patterned to cover portions of the hard mask layer 406 and the top electrode layer 404. The photoresist 410 is directly over the bottom electrode 114 after patterning, as illustrated in cross-sectional view of FIG. 6. In some embodiments, the photoresist 410 is patterned to be wider than the bottom electrode 114.

Figure 7:
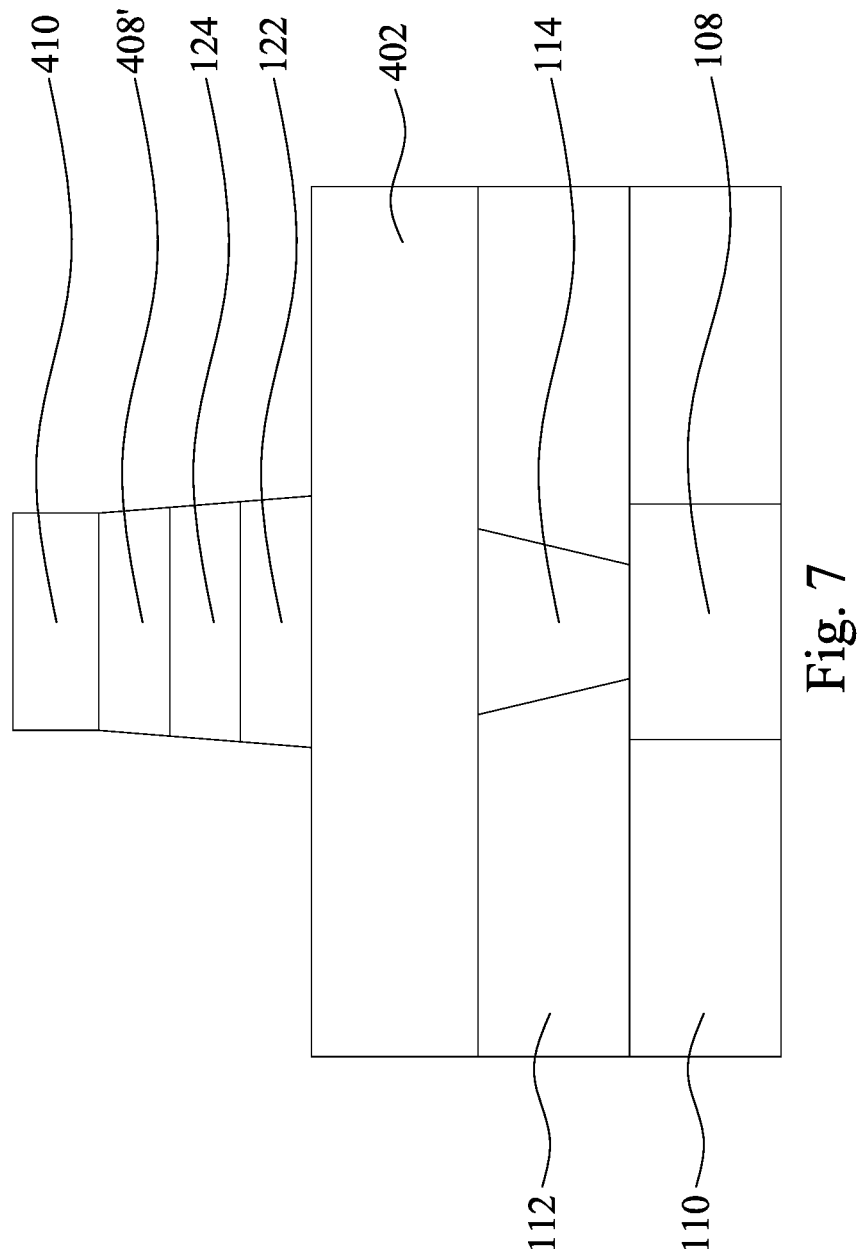

As shown in cross-sectional view of FIG. 7, an etch process comprising three steps is conducted on the organic mask layer (408 of FIG. 6) according to the photoresist 410, the hard mask layer (406 of FIG. 6) and the top electrode layer (404 of FIG. 6), and to respectively form a patterned organic mask 408', followed by a patterned hard mask 124, followed by a patterned top electrode 122. The etch process is performed within a processing chamber and may use a plasma etchant. In some embodiments, the plasma etchant may be formed as a transformer coupled plasma (TCP) by a TCP source. In other embodiments, the plasma etchant may be formed as a capacitively coupled plasma (CCP), an inductively coupled plasma (ICP), or the like.

The first step in the etch process targets the organic mask layer (408 of FIG. 6) to form the patterned organic mask 408' according to the photoresist 410. In some embodiments, the first step of the etch process is conducted within the processing chamber at a pressure in a range of between approximately 1 millitorr and approximately 100 millitorr. In some embodiments, the first step of the etch process may use a plasma etchant that is formed by a TCP source at a power in a range of between approximately 200 watts and approximately 800 watts. In some embodiments, a bias voltage is applied to a wafer chuck configured to hold structure as shown in FIG. 6. In some embodiments, the bias voltage used in the first step of the etch process is in a range of approximately 100 volts and approximately 500 volts. In some embodiments, the etching gas used in the first step of the etch process may comprise the following: oxygen ($O_2$) gas having a flow in a range of between approximately 1 standard cubic centimeter per minute and approximately 20 standard cubic centimeters per minute; chlorine ($Cl_2$) gas having a flow in a range of between approximately 5 standard cubic centimeters per minute and approximately 50 standard cubic centimeters per minute; helium (He) gas having a flow in a range of between approximately 100 standard cubic centimeters per minute and approximately 300 standard cubic centimeters per minute; and/or $CH_2F_2$ gas having a flow in a range of between approximately 10 standard cubic centimeters per minute and approximately 50 standard cubic centimeters per minute.

The second step in the etch process targets the hard mask layer (406 of FIG. 6) to form the patterned hard mask 124 according to the photoresist 410. In some embodiments, the second step of the etch process is conducted at a pressure in a range of between approximately 1 millitorr and approximately 100 millitorr. In some embodiments, the TCP source power is set to a power in a range of between approximately 200 watts and approximately 1000 watts. In some embodiments, a bias voltage is set to a voltage in a range of approximately 100 volts and approximately 700 volts. In some embodiments, the etching gas used in the second step of the etch process may comprise the following: $SF_6$ having a flow in a range of between approximately 10 standard cubic centimeters per minute and approximately 80 standard cubic centimeters per minute; $CF_4$ having a flow in a range of between approximately 10 standard cubic centimeters per minute and approximately 50 standard cubic centimeters per minute; helium gas having a flow in a range of between approximately 100 standard cubic centimeters per minute and approximately 300 standard cubic centimeters per minute; and/or $CH_2F_2$ gas having a flow in a range of between approximately 10 standard cubic centimeters per minute and approximately 100 standard cubic centimeters per minute.

The third and final step in the etch process targets the top electrode layer (404 of FIG. 6) to form the patterned top electrode 122. In some embodiments, the third step of the etch process is conducted at a pressure in a range of between approximately 1 millitorr and approximately 100 millitorr. In some embodiments, the TCP source power is set to a power in power in a range of between approximately 200 watts and approximately 1000 watts. In some embodiments, a bias voltage is set to a voltage in a range of approximately 100 volts and approximately 900 volts. In some embodiments, the etching gas used in the third step of the etch process may comprise the following: chlorine ($Cl_2$) gas having a flow in a range of between approximately 10 standard cubic centimeters per minute and approximately 200 standard cubic centimeters per minute; $CF_4$ having a flow in a range of between approximately 10 standard cubic centimeters per minute and approximately 100 standard cubic centimeters per minute; argon (Ar) gas having a flow in a range of between approximately 50 standard cubic centimeters per minute and approximately 500 standard cubic centimeters per minute; and/or HBr gas having a flow in a range of between approximately 10 standard cubic centimeters per minute and approximately 100 standard cubic centimeters per minute.

Figure 8:
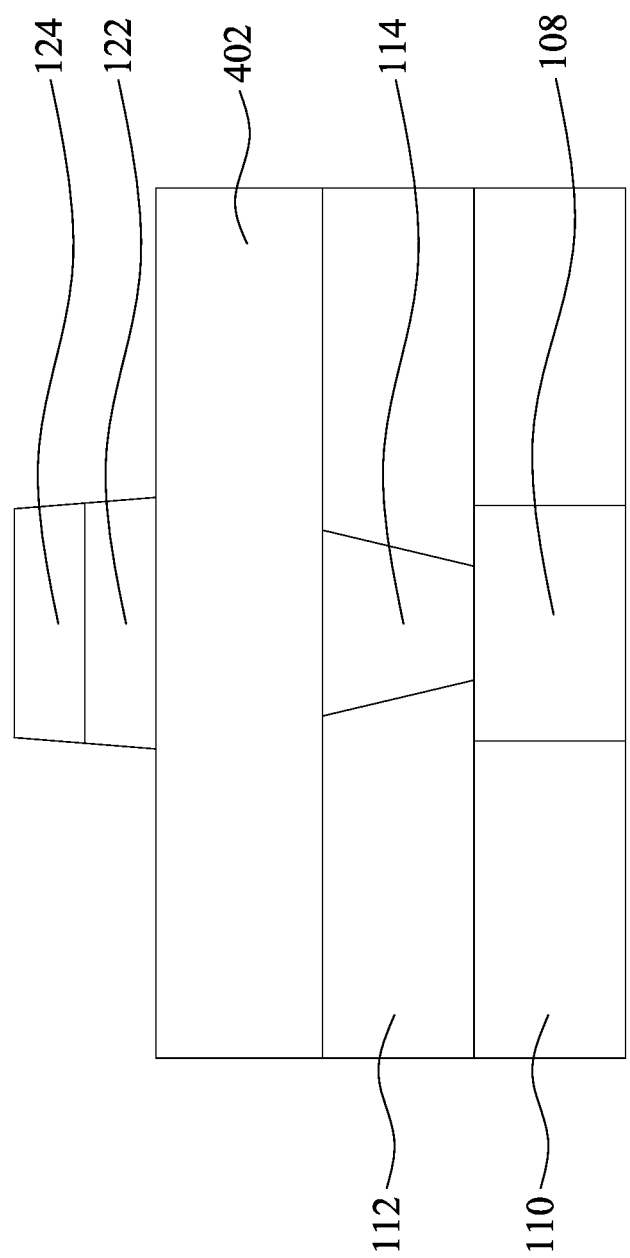

As shown in cross-sectional view of FIG. 8, the photoresist (410 of FIG. 7) and the patterned organic mask (408' of FIG. 7) are stripped, leaving behind the patterned top electrode 122 and the patterned hard mask 124 over the patterned top electrode 122. The deposited phase change material layer 402 is wider than the patterned top electrode 122 and the patterned hard mask 124.

Figure 9:
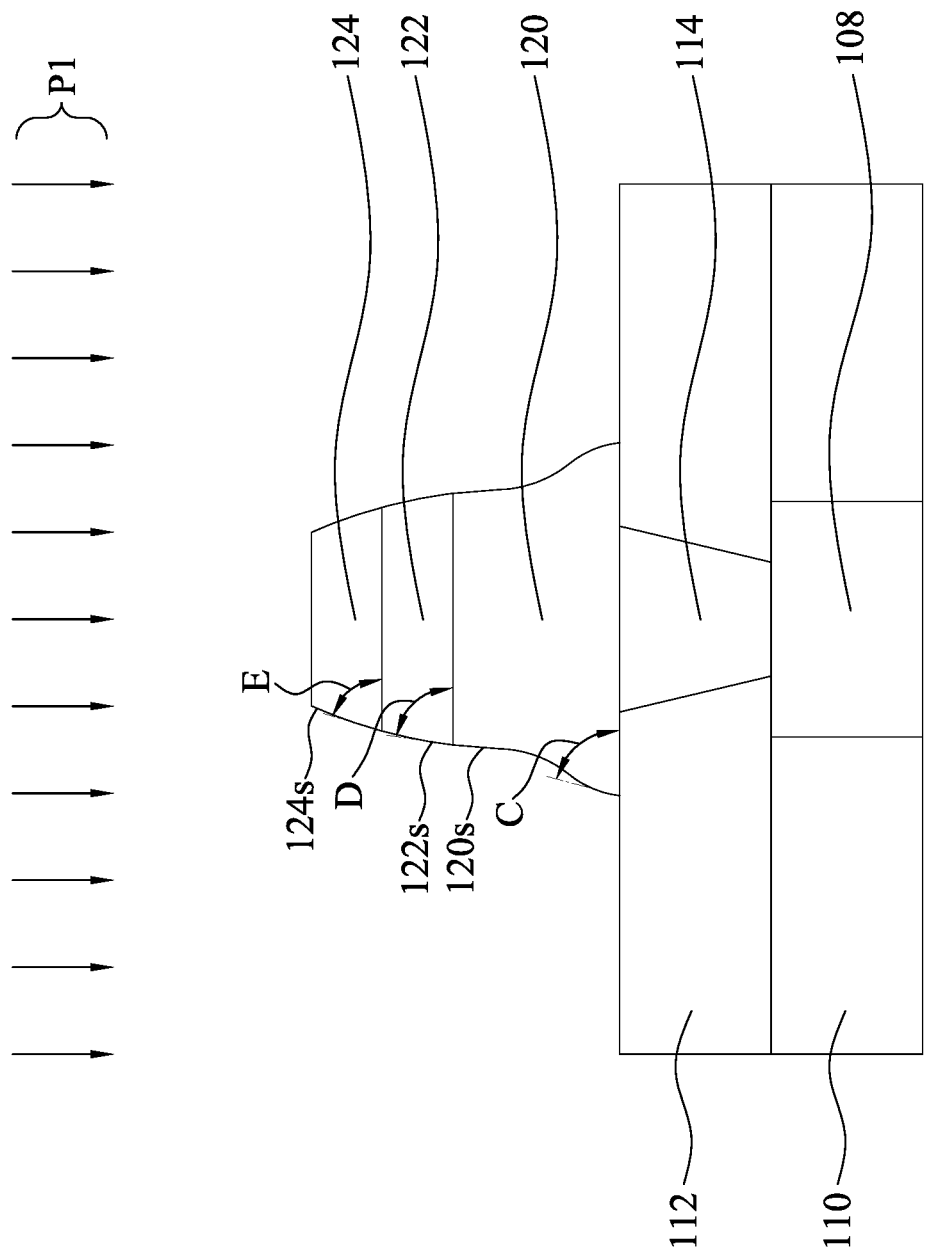

As shown in cross-sectional view of FIG. 9, a plasma etch process P1 is conducted on the deposited phase change material layer (402 of FIG. 8) to form the patterned PCE 120. The plasma etch process P1 is performed within a processing chamber and may use a plasma etchant. In some embodiments, the plasma etchant may be formed as a transformer coupled plasma (TCP) by a TCP source. In other embodiments, the plasma etchant may be formed as a capacitively coupled plasma (CCP), an inductively coupled plasma (ICP), electron cyclotron resonance (ECR), or the like.

Figure 16:
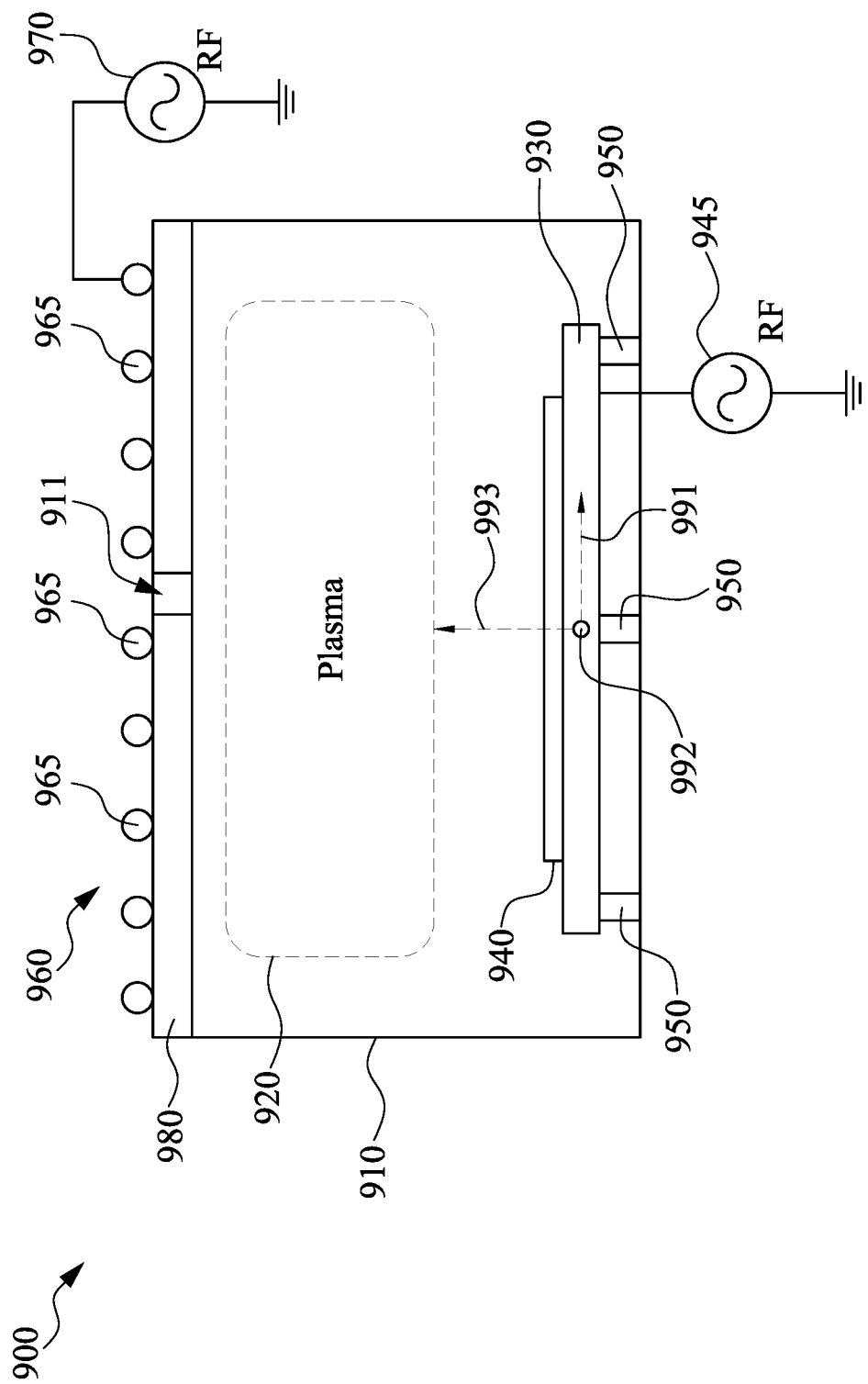
FIG. 16 illustrates some embodiments of a transformer coupled plasma (TCP) reactor which can be used in fabrication of a memory device, according to the present disclosure.

For example, the patterned PCE 120 can be formed using an exemplary TCP reactor 900 as illustrated in FIG. 16. The TCP reactor 900 includes a processing chamber 910 with a plasma containing region 920. The reactor 900 includes a wafer chuck 930 disposed underneath the plasma containing region 920. The wafer chuck 930 includes an electrostatic chuck (ESC) for securing a semiconductor wafer 940 that includes a structure as shown in FIG. 8. The wafer chuck 930 is coupled to a radio frequency (RF) power source 945 for biasing the wafer 940, which helps direct charged plasma radix or ions toward the wafer 940 during processing. Alternatively, a matching network (not shown) may optionally be coupled between the wafer chuck 930 and the RF power source 945. A plurality of micro-actuators 950 are coupled underneath the wafer chuck 930 and positioned around a perimeter of the wafer chuck 930.

The TCP reactor 900 further includes a power source 960 located on a top portion of the processing chamber 910. The power source 960 includes a flat spiral coil 965 that is coupled to an RF power source 970. Alternatively, a matching network (not shown) may be coupled between the coil 965 and RF power source 970 for matching impedances and increasing efficiency. The flat spiral coil 965 is separated from the plasma containing region 920 by a dielectric plate 980. The dielectric plate 980 includes a quartz material or other suitable material. The TCP reactor 900 also includes one or more gas inlet apertures 911 for allowing process gases to be pumped into processing chamber 910 and one or more gas outlet apertures (not shown) for allowing vacuum evacuation to maintain an operating pressure in the processing chamber 910.

During operation, the semiconductor wafer 940 is secured on the electrostatic chuck 930. The wafer 940 includes a phase change material layer 402 (as shown in FIG. 8) that is ready for a plasma process such as a high-density plasma etching process. Initially, the chuck 930 is positioned in a plane (e.g., xy-plane) that is parallel to an x-axis 991 and y-axis 992, and perpendicular to a z-axis 993. The y-axis 992 is pointing directly out from FIG. 16. It is understood that the x-axis 991, y-axis 992, and z-axis 993 are reference axes and are only provided to aid in understanding the description that follows. The TCP reactor 900 includes a controller for controlling various process conditions such as gas flow rate, pressure, chamber temperature, power, and radio frequency to generate plasmas in the plasma containing region 920. These process conditions can vary depending on the type of plasma process that is used for a particular application.

The flat spiral coil 965 is energized by the RF power source 970 and generates an electric field (not shown). The electric field causes dissociation of the process gases in the processing chamber 910 into ions, radicals, and electrons. The energized electrons are accelerated by the electric field and strike gas molecules which causes the gas molecules to be ionized (e.g., free electrons). This process continues and eventually the plasmas become self-sustaining within the processing chamber 910. The wafer 940 is voltage-biased via the chuck 930 which is coupled to the RF power source 945. Accordingly, the ions contained in the plasmas are directed towards the wafer 940 at a controlled angle such that an anisotropic etching with controlled etch profile can be achieved.

In some embodiments, the plasma etch process P1 as illustrated in FIG. 9 is conducted at a pressure (e.g., pressure in the processing chamber 910 in FIG. 16) in a range of between approximately 1 millitorr and approximately 100 millitorr. In some embodiments, the TCP source power of the plasma etch process P1 (e.g., power of the RF power source 970 in FIG. 16) is set to a power in power in a range of between approximately 100 watts and approximately 500 watts. In some embodiments, a bias voltage (e.g., maximum voltage of the RF power source 945 in FIG. 16) of the plasma etch process P1 is set to a voltage in a range of approximately 100 volts and approximately 500 volts. In some embodiments, the plasma etch process P1 is performed when a temperature of the electrostatic chuck 930 is in a range of between approximately 40 degrees Celsius and approximately 120 degrees Celsius, when a temperature of the sidewall of the processing chamber 910 is in a range of between approximately 40 degrees Celsius and approximately 70 degrees Celsius, and/or when a temperature of the top electrode 122 is in a range of between approximately 100 degrees Celsius and approximately 150 degrees Celsius.

In some embodiments, the etching gases used in the plasma etch process P1 (e.g., gases pumped into the processing chamber 910 through the one or more gas inlet apertures 911 as shown in FIG. 16) may comprise the following: chlorine ($Cl_2$) having a flow in a range of between approximately 10 standard cubic centimeters per minute and approximately 100 standard cubic centimeters per minute; argon (Ar) having a flow in a range of between approximately 50 standard cubic centimeters per minute and approximately 500 standard cubic centimeters per minute; HBr having a flow in a range of between approximately 10 standard cubic centimeters per minute and approximately 100 standard cubic centimeters per minute; $CH_2F_2$ having a flow in a range of between approximately 10 standard cubic centimeters per minute and approximately 50 standard cubic centimeters per minute; $SF_6$ having a flow in a range of between approximately 5 standard cubic centimeters per minute and approximately 20 standard cubic centimeters per minute; $H_2$ having a flow in a range of between approximately 2 standard cubic centimeters per minute and approximately 50 standard cubic centimeters per minute; and/or $BCl_3$ having a flow in a range of between approximately 10 standard cubic centimeters per minute and approximately 100 standard cubic centimeters per minute. In it noted that the gases used in the plasma etch process P1 is free from ammonia gas ($NH_3$ gas). Stated differently, the processing chamber (e.g., chamber 910 as shown in FIG. 16) of performing the plasma etch process P1 is free from ammonium plasmas ($NH_4^+$) resulting from protonation of ammonia gas during performing the etch process P1. In this way, an unwanted chemical reaction between ammonium plasmas and the chalcogenide material in the layer 402 can be prevented.

As shown in cross-sectional view of FIG. 9, a PCE 120, a top electrode 122, and a hard mask 124 after the completion of the plasma etch process P1 are shown for some embodiments. The PCE 120 has a trapezoid-like shape as illustrated in FIG. 9, and has a top surface that is substantially even with a bottom surface of the top electrode 122. In some embodiments, the top surface of the PCE 120 has substantially the same size as the bottom surface of the top electrode 122 after the plasma etch process P1 In some other embodiments, the top surface of the PCE 120 is wider than the bottom surface of the top electrode 122 after the plasma etch process P1. The trapezoid-like PCE 120 may have non-linear outer sidewalls 120s from a cross-sectional view, as in cross-sectional view of FIG. 9. For example, an absolute value of slope of an upper portion of the outer sidewall 120s is greater than that of a lower portion of the outer sidewall 120s. Stated differently, the upper portion of the outer sidewall 120s is steeper than the lower portion of the outer sidewall 120s.

The bottom surface of the PCE 120 approximately meets the outer sidewalls 120s of the PCE 120 at an angle C. In some embodiments, the angle C may be in a range of between approximately 45 degrees and approximately 85 degrees. The top electrode 122 may have outer sidewalls 122s that meet a bottom surface of the top electrode 122 at an angle D. The hard mask 124 may have outer sidewalls 124s that meet a bottom surface of the hard mask 124 at an angle E. In some embodiments, the angles C, D and E are substantially the same. In some other embodiments, the angles D and E may each be less than the angle C. In such embodiments, the outer sidewalls 120s of the PCE 120 are steeper than the outer sidewalls 122s of the top electrode 122 and the outer sidewalls 124s of the hard mask 124.

Figure 10:
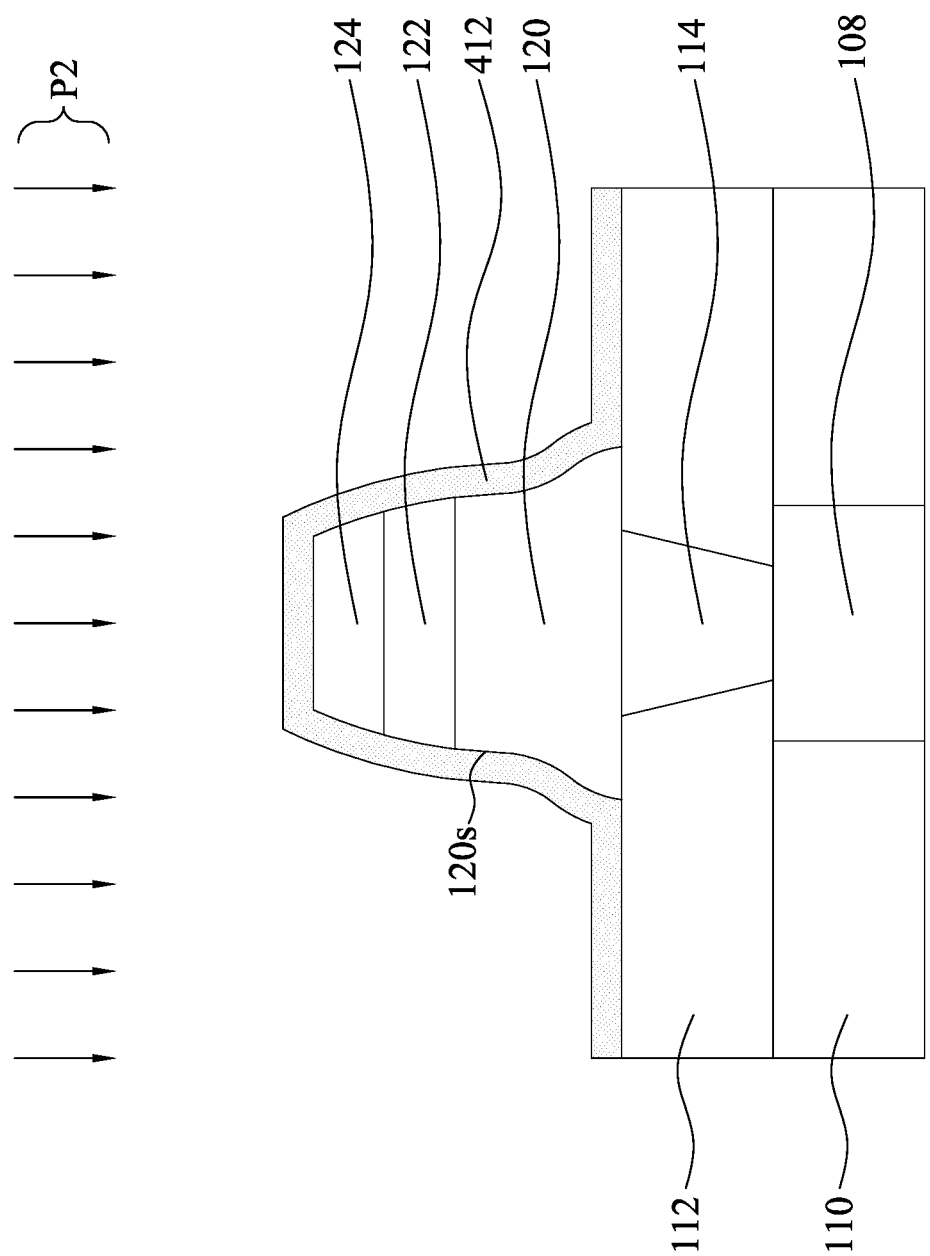

As shown in cross-sectional view of FIG. 10, immediately after the plasma etch process P1, a plasma deposition process P2 is in-situ performed to blanket deposit a protection coating layer 412 conformally over the hard mask 124, the top electrode 122, and the PCE 120. As used herein, the term "in-situ" is used to describe processes (e.g., plasma etch process P1 and plasma deposition process P2) that are performed on a wafer (e.g., the wafer 940 in FIG. 16) when the wafer remains within a same processing chamber (e.g., the processing chamber 910 in FIG. 16), and where for example, the processing chamber (e.g., the processing chamber 910 in FIG. 16) allows the wafer to remain under vacuum conditions (i.e., without breaking vacuum). As such, the term "in-situ" may also generally be used to refer to processes in which the wafer being processed is not exposed to an external environment (e.g., external to the processing chamber 910 in FIG. 16). In this way, although the PCE 120 is sensitive to moisture, the protection coating layer 412 can block the PCE 120 from moisture, because the protection coating layer 412 is in-situ deposited on the PCE 120 using, for example, the TCP reactor 900 in FIG. 16, immediately after etching the PCE 120 without breaking vacuum.

In some embodiments, gases used in the plasma deposition process P2 are selected such that the resulting plasmas are chemically inert to the PCE 120 (i.e., chalcogenide material of PCE 120 being chemically inert to plasmas in the deposition process P2). Thus, the PCE 120 is free from a chemical reaction with plasmas in the plasma deposition process P2, which in turn will reduce a risk of damages (e.g., voids formed on outer sidewalls 120s of the PCE 120) caused by unwanted chemical reactions. In this way, the outer sidewalls 120s of the PCE 120 after performing the plasm deposition process P2 has substantially the same profile as that before performing the plasma deposition process P2.

In some embodiments where the PCE 120 is made of a chalcogenide material (e.g., GST), the gases used in the plasma deposition process P2 are free from an ammonia ($NH_3$) gas, because ammonium plasmas generated from the ammonia gas would react with the chalcogenide material and in turn damage outer sidewalls 120s of the PCE 120 (e.g., creating voids on the outer sidewalls 120s of the PCE 120). In other words, the plasma deposition process P2 is performed in an ammonia-free (i.e., ammonium-free) environment for preventing damages on outer sidewalls 120s of the PCE 120. For example, the processing chamber 910 remains ammonia-free during performing the plasma deposition process P2. Moreover, the gases used in the plasma deposition process P2 are also free from an oxygen-containing gas (e.g., 02), thus preventing outer sidewalls 120s of the PCE 120 from unwanted oxidation. In other words, the plasma deposition process P2 is performed in an oxygen-free environment.

In some embodiments, gases used in the plasma deposition process P2 (e.g., gases pumped into the processing chamber 910 through the one or more gas inlet apertures 911 as shown in FIG. 16) may be a gas mixture of methane ($CH_4$) and argon (Ar) having a flow in a range of between approximately 50 standard cubic centimeters per minute and approximately 500 standard cubic centimeters per minute. The gas mixture is free from nitrogen-containing gases (e.g., ammonia gas) and oxygen-containing gases (e.g., oxygen gas) for preventing unwanted chemical reactions with the PCE 120.

In some embodiments, the plasma deposition process P2 is conducted at a pressure (e.g., pressure in the processing chamber 910 in FIG. 16) in a range of between approximately 1 millitorr and approximately 100 millitorr. In some embodiments, the TCP source power of the plasma deposition process P2 (e.g., power of the RF power source 970 in FIG. 16) is set to a power in power in a range of between approximately 300 watts and approximately 1200 watts. In some embodiments, a bias voltage (e.g., maximum voltage of the RF power source 945 in FIG. 16) of the plasma deposition process P2 is set to a voltage in a range of approximately 30 volts and approximately 100 volts. In some embodiments, the plasma deposition process P2 is performed when a temperature of the electrostatic chuck 930 is in a range of between approximately 40 degrees Celsius and approximately 120 degrees Celsius, when a temperature of the sidewall of the processing chamber 910 is in a range of between approximately 40 degrees Celsius and approximately 70 degrees Celsius, and/or when a temperature of the top electrode 122 is in a range of between approximately 100 degrees Celsius and approximately 150 degrees Celsius.

Figure 11:
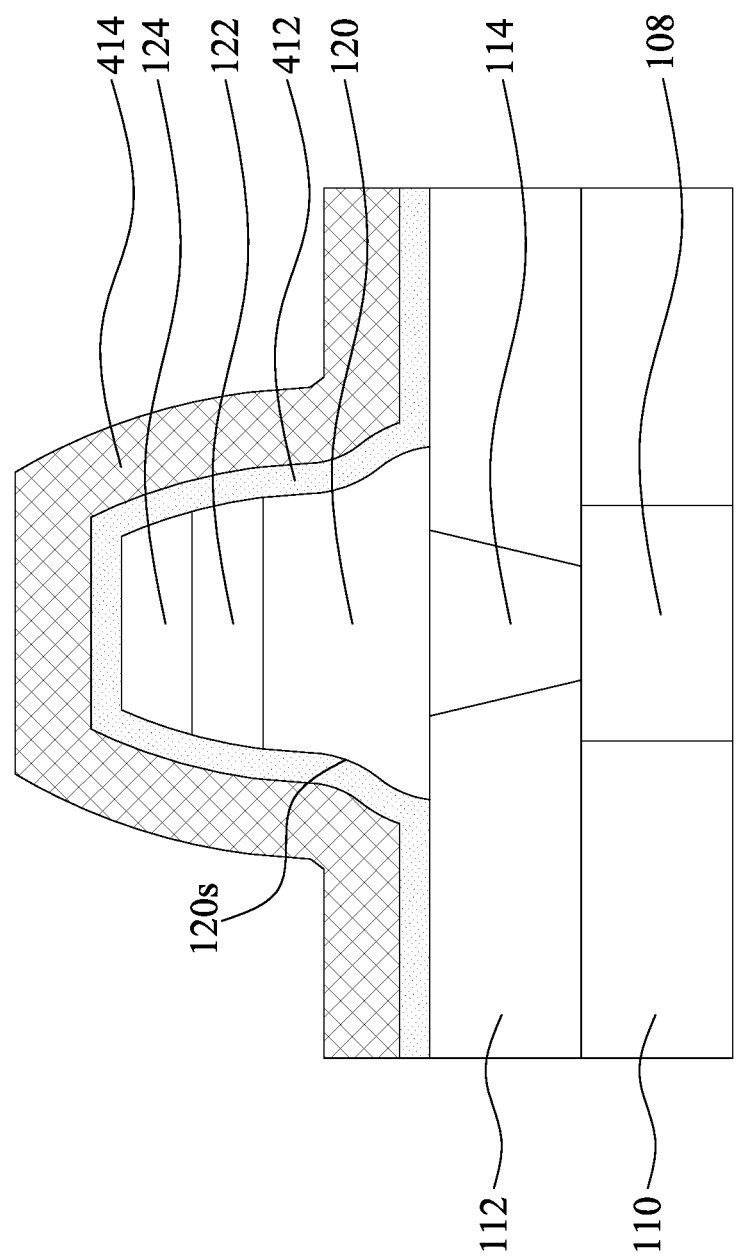

As a result of the selected gases and associated conditions of plasma deposition process P2 discussed above, the resultant protection coating layer 412 is a binary carbon-hydrogen compound layer (i.e., compound free from nitrogen and oxygen). For example, the protection coating layer 412 may be a $CH_x$ binary compound, wherein x is between 2 and 4. In some embodiments, the thickness of the protection coating layer 412 may be in a range of between approximately 10 angstroms and approximately 20 angstroms. If the thickness of the protection coating layer 412 is greater than approximately 20 angstroms, then it may suffer from film-to-film adhesion issues (e.g., poor adhesion between the protection coating layer 412 and a subsequently formed sidewall spacer layer 414 as shown in FIG. 11), and might further have unsatisfactory surface roughness. If the thickness of the protection coating layer 412 is less than approximately 10 angstroms, then the sidewall protection for the PCE 120 might be unsatisfactory.

As shown in cross-sectional view of FIG. 11, a deposition process is performed to form a first sidewall spacer layer 414 over protection coating layer 412. In some embodiments, the first sidewall spacer layer 414 may, for example, be or comprise a material such as silicon nitride (SiN or $Si_3N_4$), silicon carbide (SiC), or other suitable dielectric materials. In some embodiments, the first sidewall spacer layer 414 may be a nitrogen-containing layer, such as a silicon nitride layer, deposited using, for example, CVD, ALD, PVD or other suitable deposition processes. Because the first sidewall spacer layer 414 is a nitrogen-containing layer and the protection coating layer 412 is nitrogen-free, the first sidewall spacer layer 414 has a greater nitrogen atomic concentration than the protection coating layer 412. For example, the protection coating layer 412 has a zero value in nitrogen atomic concentration, and the first sidewall spacer layer 414 has a non-zero value (i.e., positive value) in nitrogen atomic concentration. Notably, the protection coating layer 412 ideally has a zero value in nitrogen atomic concentration, but the resultant protection coating 125 in a final IC product (as shown in FIG. 4) may have a non-zero value in nitrogen atomic concentration due to unintentional thermal diffusion in following process steps in the back-end-of-line (BEOL). However, in the final IC product the resultant protection coating 125 may still have a lower nitrogen atomic concentration than the resultant first sidewall spacer 126.

The nitrogen-containing layer 414 can be deposited in an oxygen-free environment (e.g., in an oxygen-free chamber such as 910 of FIG. 16), thus resulting in a nitrogen-containing but oxygen-free layer 414. Because the first sidewall spacer layer 414 includes nitride but free from oxygen, it can prevent the PCE 120 from unwanted oxidation caused by outgassing of oxide materials, and/or provides improved protection for the PCE 120 against halogen etchant (e.g., fluorine, chlorine and/or bromine) used in following etching processes (e.g., anisotropic etch as shown in FIG. 12).

In some embodiments where the first sidewall spacer layer 414 is an oxygen-free silicon nitride layer, it can be formed by a plasma deposition process using a silicon-containing precursor (e.g., silane, disilane or trisilane or the line) and a nitrogen-containing precursor (e.g., ammonia), without an oxygen-containing precursor (e.g., oxygen). If this silicon nitride layer is formed directly on the PCE 120 (i.e., in contact with PCE 120) without the intervening protection coating layer 412, the chalcogenide material of the PCE 120 would exposed to ammonium plasmas generated from the ammonia gas, thus reacting with the ammonium plasmas. Such a chemical reaction might create voids on the outer sidewalls 120s of the PCE 120. However, because the PCE 120 is entirely covered or coated by the protection coating layer 412 in some embodiments of the present disclosure, the protection coating layer 142 can block the PCE 120 from the ammonium plasmas, which in turn will prevent forming voids on sidewalls 120s of the PCE 120 during formation of the first sidewall spacer layer 414.

Moreover, the $CH_x$ binary compound of the protection coating 125 is chemically inert to plasmas generated from the silicon-containing precursor (e.g., silane, disilane or trisilane or the line) and the nitrogen-containing precursor (e.g., ammonia), and thus the deposition of the first sidewall spacer layer 414 will not induce a chemical reaction with the protection coating 125, which in turn will prevent damaging the protection coating 125. Furthermore, the $CH_x$ binary compound can provide a higher adhesion with silicon nitride than ternary carbon-hydrogen compounds, and thus an improved adhesion between the first sidewall spacer layer 414 and the protection coating 125 can be achieved due to the $CH_x$ binary compound in the protection coating 125. In some embodiments, the deposition of the first sidewall spacer layer 414 reaches a maximum temperature less than approximately 250 degrees Celsius, which in turn will reduce the risk of melting, boiling and/or sublimation of the PCE 120.

Figure 12:
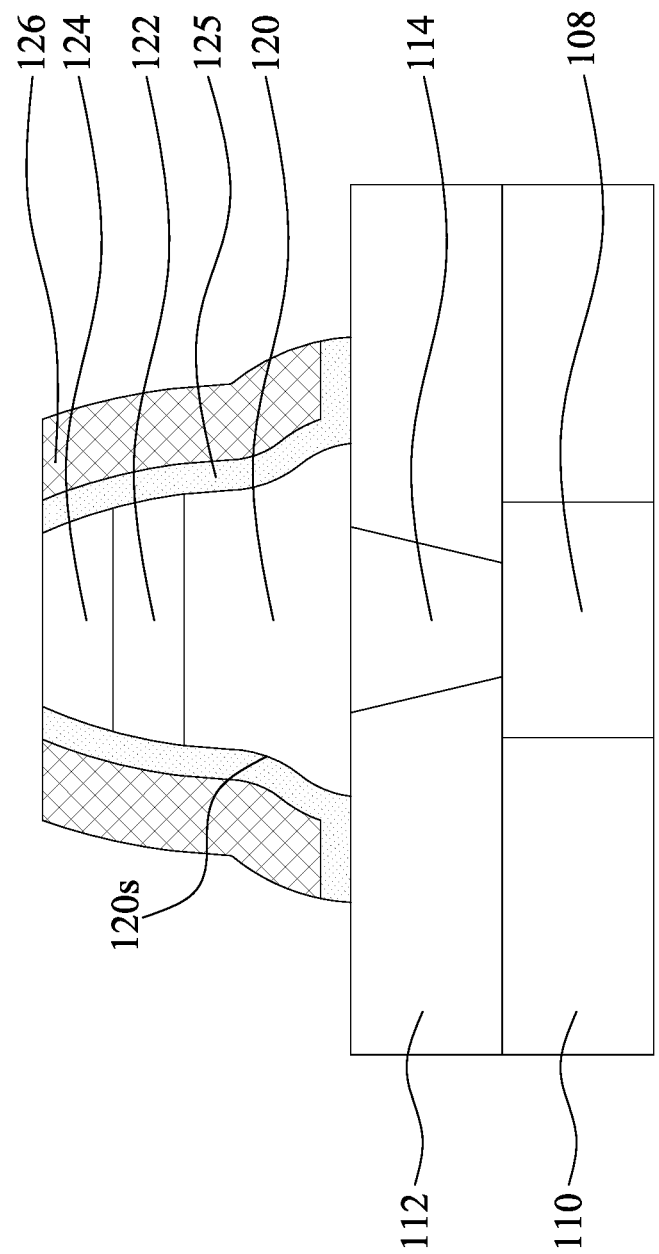

As shown in cross-sectional view of FIG. 12, one or more anisotropic etch processes are performed to remove horizontal portions of the first sidewall spacer layer (414 of FIG. 11) and the protection coating layer (412 of FIG. 11) from the hard mask 124 and the dielectric layer 112, while leaving inclined portions (or vertical portions) of the first sidewall spacer layer 414 as a first sidewall spacer 126, and portions of the protection coating layer 412 surrounded by the first sidewall spacer 126 as a protection coating 125. In some embodiments, the anisotropic etch process is a plasma etching process. In greater detail, the anisotropic etch process is performed by exposing the first sidewall spacer layer 414 to a plasma etchant (e.g., fluorine, chlorine and/or bromine plasmas).

If the outer sidewalls 120s of the PCE 120 already have damages caused by previous process steps (e.g., voids resulting from plasma deposition of the sidewall spacer layer 414), the plasma etchant (e.g., fluorine, chlorine and/or bromine plasmas) might aggravate the damages on the outer sidewalls 120s of the PCE 120 (e.g., enlarging the voids on the outer sidewalls 120s of the PCE 120). However, because the protection coating layer 412 can prevent the outer sidewalls 120s of the PCE 120 from being damaged (e.g., preventing formation of voids), the outer sidewalls 120s of the PCE 120 can still remain substantially intact during the plasma etch process. Moreover, because the first sidewall spacer layer 414 is free from oxygen, it can provide enhanced etch resistance against the plasma etchant and hence improved protection for the protection coating layer 125 and/or the PCE 120 during the anisotropic etching process.

Figure 13:
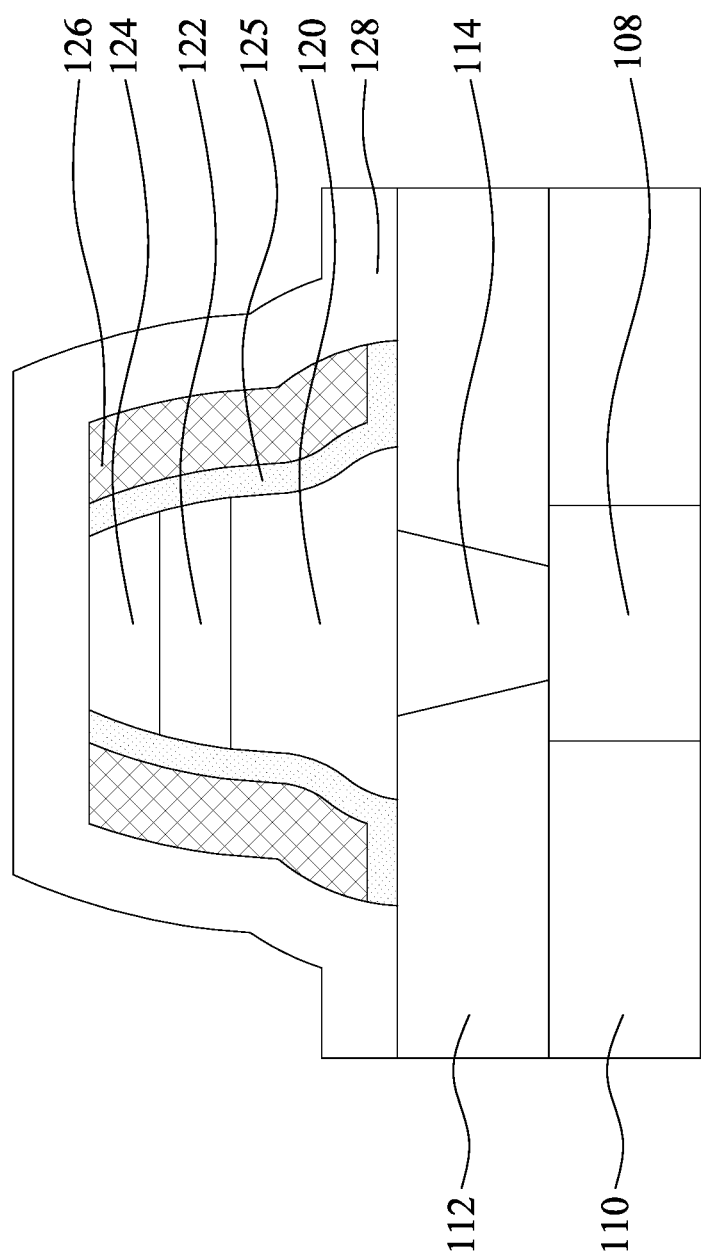

As shown in cross-sectional view of FIG. 13, a deposition process is performed to form a second sidewall spacer 128 blanket over the hard mask 124, the dielectric layer 112, and the first sidewall spacer 126. In some embodiments, the second sidewall spacer 128 may, for example, be or comprise an oxygen-free material such as SiC. Because the second sidewall spacer 128 includes is free from oxygen, it can prevent the PCE 120 from unwanted oxidation caused by outgassing of oxide materials. The deposition process may, for example, be performed by CVD, PVD, some other suitable deposition process(es), or any combination of the foregoing. In some embodiments, the deposition process reaches a maximum temperature less than approximately 350 degrees Celsius.

As shown in cross-sectional view of FIG. 14, a deposition process is performed to form an IMD layer 130 over the second sidewall spacer 128. In some embodiments, the IMD layer 130 may, for example, be or comprise an oxide, such as silicon dioxide, an extreme low-k dielectric, or the like. The deposition process of forming the IMD layer 130 may, for example, be performed by CVD, PVD, a spin-on process, some other suitable deposition process(es), or any combination of the foregoing. In some embodiments, the deposition process reaches a maximum temperature less than approximately 400 degrees Celsius.

The IMD layer 130 is an oxygen-containing layer (e.g., an oxide layer or a porous oxide layer) for lowering a dielectric constant of the IMD layer 130 and in turn reducing resistance-capacitance (RC) delay. Because the IMD layer 130 is an oxygen-containing layer, and the protection coating 125, the first and second sidewall spacers 126 and 128 are oxygen-free, the IMD layer 130 has a greater oxygen atomic concentration than the protection coating 125, the first and second sidewall spacers 126 and 128. For example, the protection coating 125, the first and second sidewall spacers 126 and 128 may have a zero value in oxygen atomic concentration, and the IMD layer 130 has a non-zero value (i.e., positive value) in oxygen atomic concentration. Notably, the protection coating 125, the first and second sidewall spacers 126 and 128 ideally have a zero value in oxygen atomic concentration, but the protection coating 125, the first and second sidewall spacers 126 and 128 in a final IC product (as shown in FIG. 4) may have a non-zero value in oxygen atomic concentration due to unintentional thermal diffusion in following process steps in the BEOL. However, in the final IC product the protection coating 125, the first and second sidewall spacers 126 and 128 may still have a lower oxygen atomic concentration than the IMD layer 130.

In some embodiments, the oxygen might outgass during formation of the IMD layer 130 and/or in one or more following process steps in the BEOL. If the outgassing oxygen gas reaches the outer sidewalls 120s of the PCE 120, unwanted oxidation of the PCE 120 might occur. However, because the outer sidewalls 120s of the PCE 120 are separated from the IMD layer 130 by triple oxygen-free layers (e.g., layers 125, 126 and 128), instead of dual oxygen-free layers (e.g., dual spacer layers 126 and 128 without the coating layer 125) or a single oxygen-free layer (single spacer layer 126 without the coating layer 125 and spacer layer 128), the outgassing from the IMD layer 130 to the outer sidewalls 120s of the PCE 120 can be suppressed, which in turn will prevent unwanted oxidation of the PCE 120.

Moreover, if the chalcogenide material of the PCE 120 outgasses to an ambient environment during formation of the IMD layer 130 and/or in one or more following process steps in the BEOL, the gases of the chalcogenide material might react with moisture in the ambient environment and in turn generate toxic gases. However, because the outer sidewalls 120s of the PCE 120 are separated from the IMD layer 130 by triple layers (e.g., layers 125, 126 and 128), instead of dual layers (e.g., dual spacer layers 126 and 128 without the coating layer 125) or a single layer (single spacer layer 126 without the coating layer 125 and spacer layer 128), the outgassing from the outer sidewalls 120s of the PCE 120 to the ambient environment can be suppressed, which in turn will prevent generating toxic gases during formation of the IMD layer 130 and/or in one or more following process steps in the BEOL.

After formation of the IMD layer 130, a conductive via 132 is formed in the IMD layer 130 and over the top electrode 122, and an upper conductive wire 134 is formed in the IMD layer 130 and over the conductive via 132. The conductive via 132 and upper conductive wire 134 may, for example, be formed by: patterning the IMD layer 130 to form a via opening and a trench with a pattern of the conductive via 132 and the upper conductive wire 134 using a dual damascene process; depositing one or more conductive layers (e.g., metal layers) filling the via opening and trench and covering the IMD layer 130; and performing a planarization (e.g., chemical mechanical planarization) on the one or more conductive layers until the IMD layer 130 is reached. The patterning may, for example, be performed by a photolithography/etching process and/or some other suitable patterning process(es). In some embodiments, the conductive via 132 and the upper conductive wire 134 may have no distinguishable interface therebetween, if they are deposited is a same deposition process as discussed above.

Figure 15A:
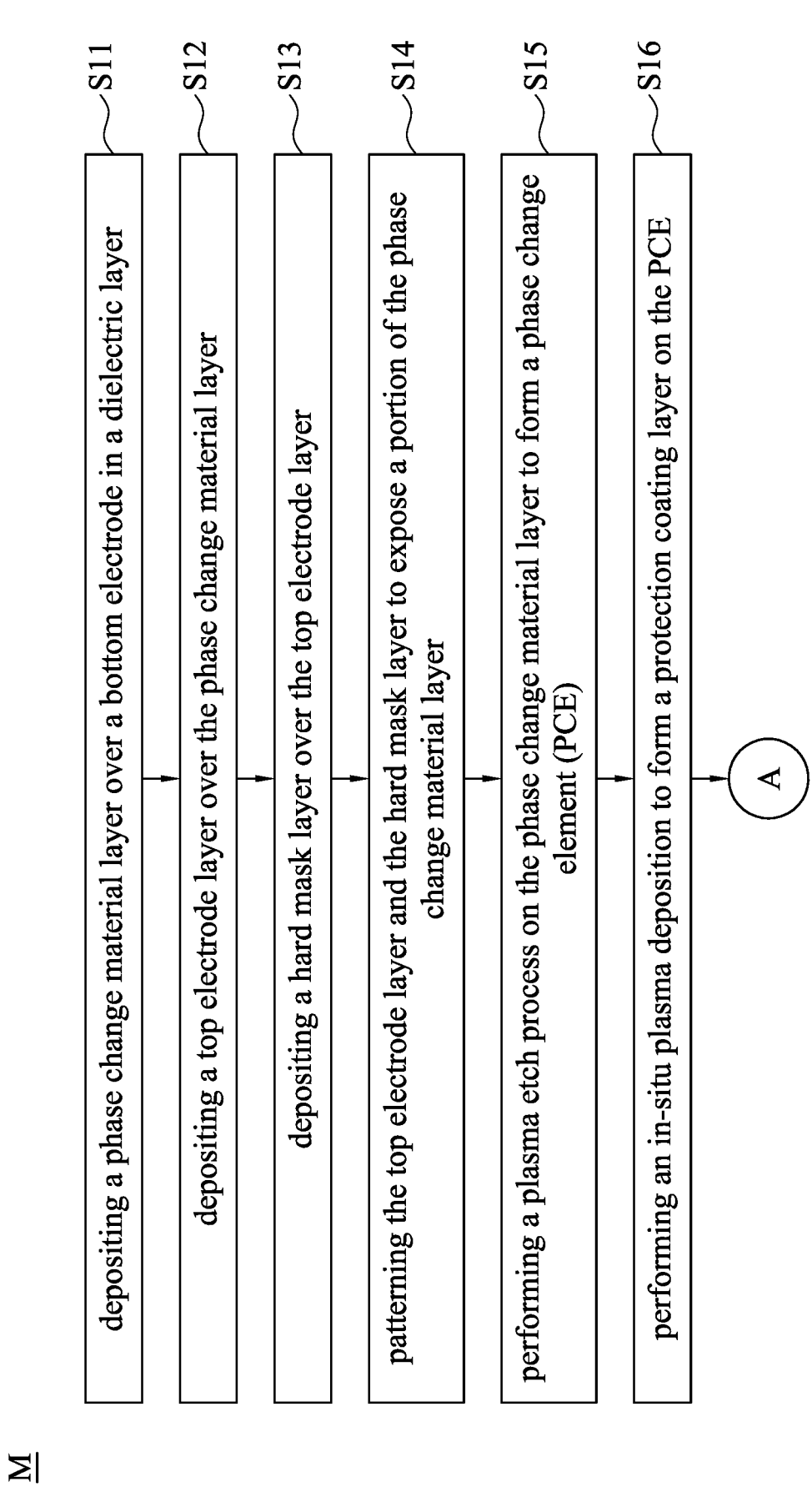
FIGS. 15A and 15B illustrate a method of forming a memory device in accordance with some embodiments.
Figure 15B:
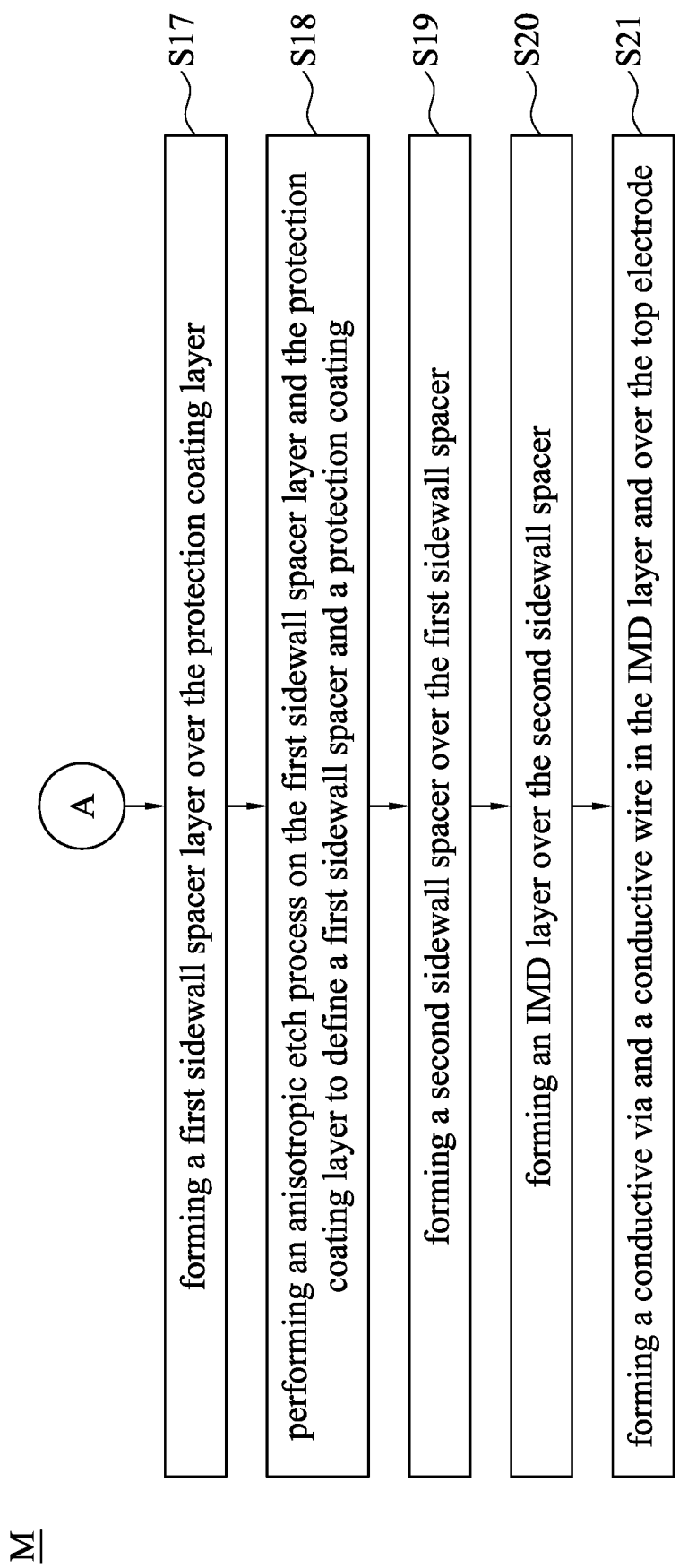

FIGS. 15A and 15B illustrate a method M of forming a memory device in accordance with some embodiments. Although the method M is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S11, a phase change material layer is deposited over a bottom electrode in a dielectric layer.

At block S12, a top electrode layer is deposited over the phase change material layer.

At block S13, a hard mask layer is deposited over the top electrode layer. FIG. 5 illustrates a cross-sectional view of some embodiments corresponding to acts in blocks S11-S13.

At block S14, the top electrode layer and hard mask layer are patterned to expose a portion of the phase change material layer. FIG. 7 illustrates a cross-sectional view of some embodiments corresponding to act in block S14.

At block S15, a plasma etch process is performed on the exposed portion of the phase change material layer, thus forming a PCE covering the bottom electrode and exposing a portion of the dielectric layer. FIG. 9 illustrates a cross-sectional view of some embodiments corresponding to act in block S15.

At block S16, a protection coating layer is deposited to cover a stack of the PCE, the top electrode and the hard mask using a plasma deposition process in-situ performed with the plasma etch process of block S15. FIG. 10 illustrates a cross-sectional view of some embodiments corresponding to act in block S16.

At block S17, a first sidewall spacer layer is formed over the protection coating layer. FIG. 11 illustrates a cross-sectional view corresponding to some embodiments of act in block S17.

At block S18, an anisotropic etch process is performed on the first sidewall spacer layer and the protection coating layer to define a first sidewall spacer and a protection coating. FIG. 12 illustrates a cross-sectional view corresponding to some embodiments of act in block S18.

At block S19, a second sidewall spacer is formed over the first sidewall spacer. FIG. 13 illustrates a cross-sectional view corresponding to some embodiments of act in block S19.

At block S20, an IMD layer is formed over the second sidewall spacer.

At block S21, a conductive via and a conductive wire are formed in the IMD layer and over the top electrode. FIG. 14 illustrates a cross-sectional view of some embodiments corresponding to acts in blocks S20 and S21.

Based on the above discussions, it can be seen that the present disclosure offers following advantages. It is understood, however, that other embodiments may offer additional advantages, and not all advantages are necessarily disclosed herein, and that no particular advantage is required for all embodiments.

One advantage is that the protection coating is deposited on the PCE without using a nitrogen-containing precursor that would lead to voids on PCE's outer sidewalls due to a chemical reaction between the nitrogen-containing precursor and the chalcogenide material in the PCE. Thus, voids on the PCE's outer sidewalls can be reduced.

Another advantage is that the protection coating is formed on the PCE using plasmas chemically inert to PCE and hence prevents damaging outer sidewalls of the PCE (e.g., forming voids on PCE's outer sidewalls). Thus, voids on the PCE's outer sidewalls can be reduced.

Another advantage is that the protection coating blocks outer sidewalls of the PCE from reactive plasmas (e.g., ammonium plasmas) during formation of a nitride-based spacer layer and/or etchants (e.g., fluorine, chlorine and/or bromine) during patterning the nitride-based spacer layer. Thus, voids on the PCE's outer sidewalls can be reduced.

Another advantage is that the protection coating improves outgassing suppression from the PCE to an ambient environment and thus reduces toxic gases caused by chemical reactions between gases of the chalcogenide material and moisture in the ambient environment.

Another advantage is that the protection coating improves outgassing suppression from the IMD layer to the PCE and thus reduces unwanted oxidation of the PCE caused by the outgassing of the oxide material in the IMD layer.

In some embodiments, the present disclosure relates to a method including: forming a phase change element over a bottom electrode and a top electrode over the phase change element; forming a protection layer around the phase change element; and after forming the protection layer, forming a nitrogen-containing sidewall spacer layer around the protection layer.

In some embodiments, the present disclosure relates to a method including: forming a phase change element over a bottom electrode and a top electrode over the phase change element; performing a deposition process in a processing chamber to deposit a protection coating layer on an outer sidewall of the phase change element, wherein the processing chamber is free from an ammonium plasma during performing the deposition process; and after performing the deposition process, forming a first sidewall spacer layer over the protection coating layer.

In some embodiments, the present disclosure relates to a PCRAM device including: a memory cell overlying an inter-metal dielectric (IMD) layer and comprising a bottom electrode, a top electrode and a phase change element between the top electrode and the bottom electrode; a protection coating on an outer sidewall of the phase change element; and a first sidewall spacer on an outer sidewall of the protection coating, wherein the first sidewall spacer has a greater nitrogen atomic concentration than the protection coating.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a memory cell overlying an inter-metal dielectric (IMD) layer, the memory cell comprising a bottom electrode, a top electrode and a phase change element between the top electrode and the bottom electrode;

a protection coating on an outer sidewall of the phase change element, wherein the protection coating consists of a binary compound of carbon and hydrogen; and a first sidewall spacer on an outer sidewall of the protection coating, the first sidewall spacer having a greater nitrogen atomic concentration than the protection coating, wherein the protection coating forms a first interface with the phase change element, the first interface has a first slope at a first position and a second slope at a second position higher than the first position, the second slope is different from the first slope.

2. The memory device of claim 1, wherein the protection coating forms a second interface with the top electrode, wherein the second interface has a third slope different from the second slope of the first interface.

3. The memory device of claim 2, wherein the third slope of the second interface is different from the first slope of the first interface.

4. The memory device of claim 1, wherein the first sidewall spacer is formed of a nitride-based material.

5. The memory device of claim 4, further comprising:
a carbide-based spacer over the nitride-based material of the first sidewall spacer.

6. The memory device of claim 1, wherein the protection coating forms a third interface with a hard mask above the top electrode, and the third interface has a fourth slope different from the second slope of the first interface.

7. The memory device of claim 6, wherein the fourth slope of the third interface is different from the first slope of the first interface.

8. The memory device of claim 1, wherein the binary compound of the protection coating is a $CH_x$ binary compound, wherein x is between 2 and 4.

9. The memory device of claim 1, wherein the phase change element has a non-linear sidewall comprising a convex profile and a concave profile above the convex profile.

10. A memory device, comprising:
a memory cell comprising a bottom electrode, a top electrode and a phase change element between the top electrode and the bottom electrode;
a nitride-free spacer on a sidewall of the memory cell, wherein the nitride-free spacer consists of a binary compound of carbon and hydrogen; and
a nitride spacer on a sidewall of the nitride-free spacer, the nitride spacer forming a non-linear interface with the nitride-free spacer, the non-linear interface having a first curvature at a first position and a second curvature at a second position higher than the first position, the second curvature being different from the first curvature.

11. The memory device of claim 10, wherein the binary compound of carbon and hydrogen is a $CH_x$ binary compound, wherein x is between 2 and 4.

12. The memory device of claim 10, wherein from a cross-sectional view, the phase change element has a sidewall profile conformal to a portion of the non-linear interface formed by the nitride spacer and the nitride-free spacer.

13. The memory device of claim 10, wherein from a cross-sectional view, the top electrode has a sidewall profile conformal to a portion of the non-linear interface formed by the nitride spacer and the nitride-free spacer.

14. The memory device of claim 10, further comprising:
a carbide spacer over the nitride spacer.

15. The memory device of claim 14, wherein the carbide spacer forms a non-linear interface with the nitride spacer.

16. The memory device of claim 10, wherein the phase change element has a non-linear sidewall comprising a convex profile and a concave profile above the convex profile.

17. A memory device, comprising:
a memory cell comprising a bottom electrode, a phase change element over the bottom electrode, and a top electrode over the phase change element, wherein from a cross-sectional view, a sidewall of the phase change element has more than one curvature change;
a first spacer in contact with the sidewall of the phase change element, and a sidewall of the top electrode, wherein an entirety of the first spacer is a binary compound of carbon and hydrogen; and
a second spacer in contact with the first spacer.

18. The memory device of claim 17, wherein the first spacer has an outer sidewall spaced apart from the phase change element, and the outer sidewall of the first spacer has more than one curvature change.

19. The memory device of claim 17, wherein an outer sidewall of the second spacer has more than one curvature change.

20. The memory device of claim 17, wherein the sidewall of the phase change element has a convex profile and a concave profile above the convex profile.

* * * * *